US012701695B2

(12) United States Patent (10) Patent No.: US 12,701,695 B2

Lee et al. (45) Date of Patent: Aug. 4, 2026

(54) MEMORY DEVICE INCLUDING STRUCTURES IN MEMORY ARRAY REGION AND PERIPERAL CIRCUITRY REGION

(71) Applicant: Micron Technology, Inc., Boise, ID (US)

(72) Inventors: Si-Woo Lee, Boise, ID (US); Terrence B. Mcdaniel, Caldwell, ID (US); Guangjun Yang, Meridian, ID (US); Vinay Nair, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 685 days.

(21) Appl. No.: 17/892,603

(22) Filed: Aug. 22, 2022

(65) Prior Publication Data

US 2024/0064972 A1 Feb. 22, 2024

(51) Int. Cl.
H10B 12/00 (2023.01)

(52) U.S. Cl.
CPC ............. H10B 12/50 (2023.02); H10B 12/09 (2023.02); H10B 12/31 (2023.02); H10B 12/34 (2023.02)

(58) Field of Classification Search
CPC ...... H10B 12/053; H10B 12/09; H10B 12/31; H10B 12/315; H10B 12/34; H10B 12/50
See application file for complete search history.

(56) References Cited

U.S. PATENT DOCUMENTS

| | | | | |
|---|---|---|---|---|
| 9,941,363 | B2 * | 4/2018 | Cheng ................. | H10D 62/824 |
| 2021/0013305 | A1 * | 1/2021 | Karda ................... | H10B 12/34 |
| 2022/0139927 | A1 * | 5/2022 | Chang ................. | H10B 12/315 |
| | | | | 257/296 |
| 2024/0006478 | A1 * | 1/2024 | Karda ................... | H10B 12/34 |
| 2024/0057317 | A1 * | 2/2024 | Hwang ............... | H10B 12/056 |

FOREIGN PATENT DOCUMENTS

KR 20240059102 A * 5/2024 ............... C10J 3/72

* cited by examiner

*Primary Examiner* — Edward Chin

(74) *Attorney, Agent, or Firm* — Schwegman Lundberg & Woessner, P.A.

(57) ABSTRACT

Some embodiments include apparatuses and methods of forming the apparatuses. One of the apparatuses includes data lines; first structures located in a first region, electrically separated from each other, and including first conductive contacts coupled to the data lines; second conductive contacts located in the first region and coupled to memory elements of the apparatus; second structures located in a second region, electrically separated from each other, and including respective gates of transistors in the second region; a first dielectric material formed in the second region and including a first portion and a second portion, the first portion formed at a first side of a structure among the second structures, the second portion formed at a second side first of the structure; and a second dielectric material formed over the first structures and the second structure. A portion of the second dielectric material contacts the first portion of the first dielectric material.

17 Claims, 24 Drawing Sheets

200

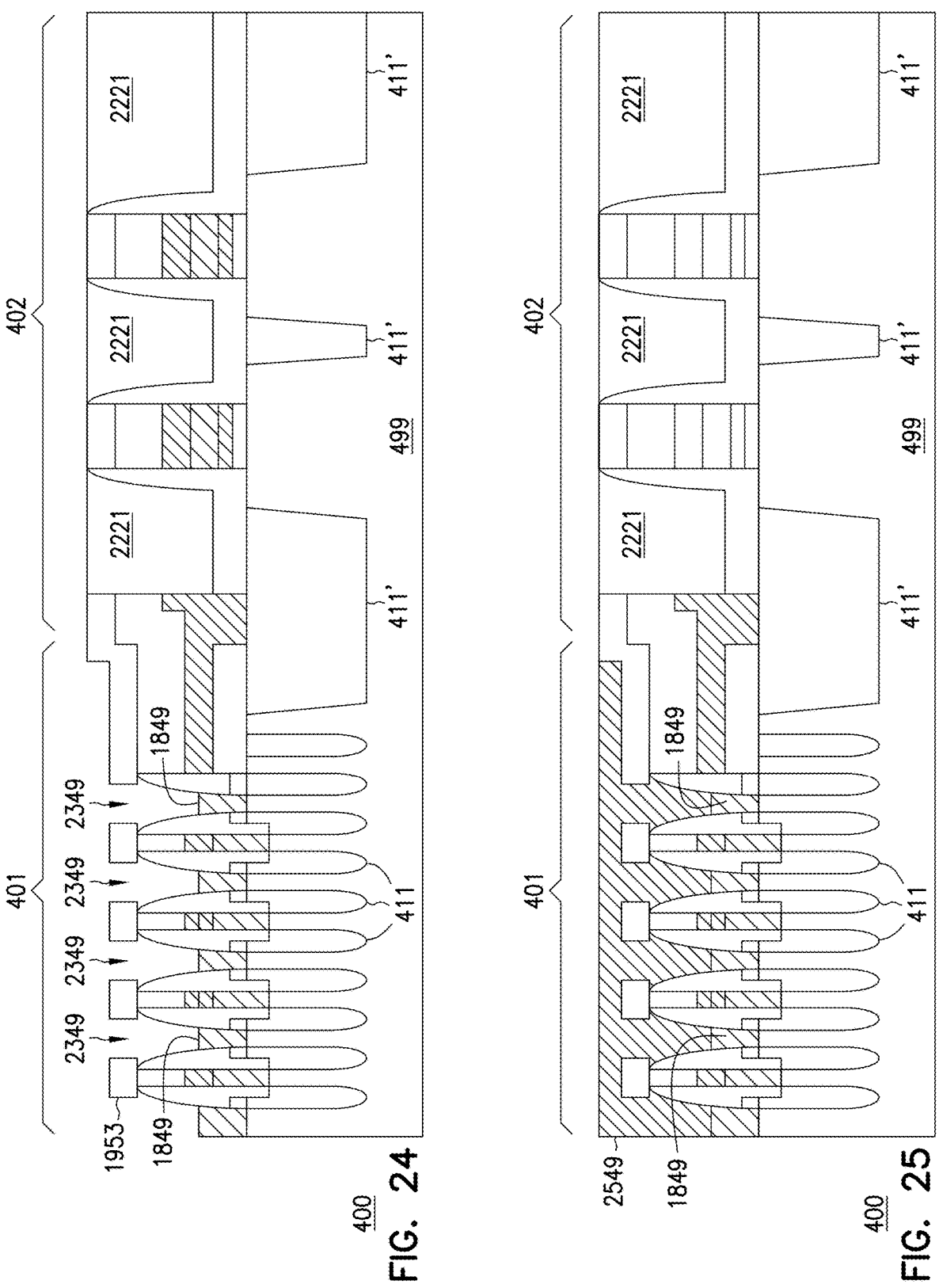

400

400

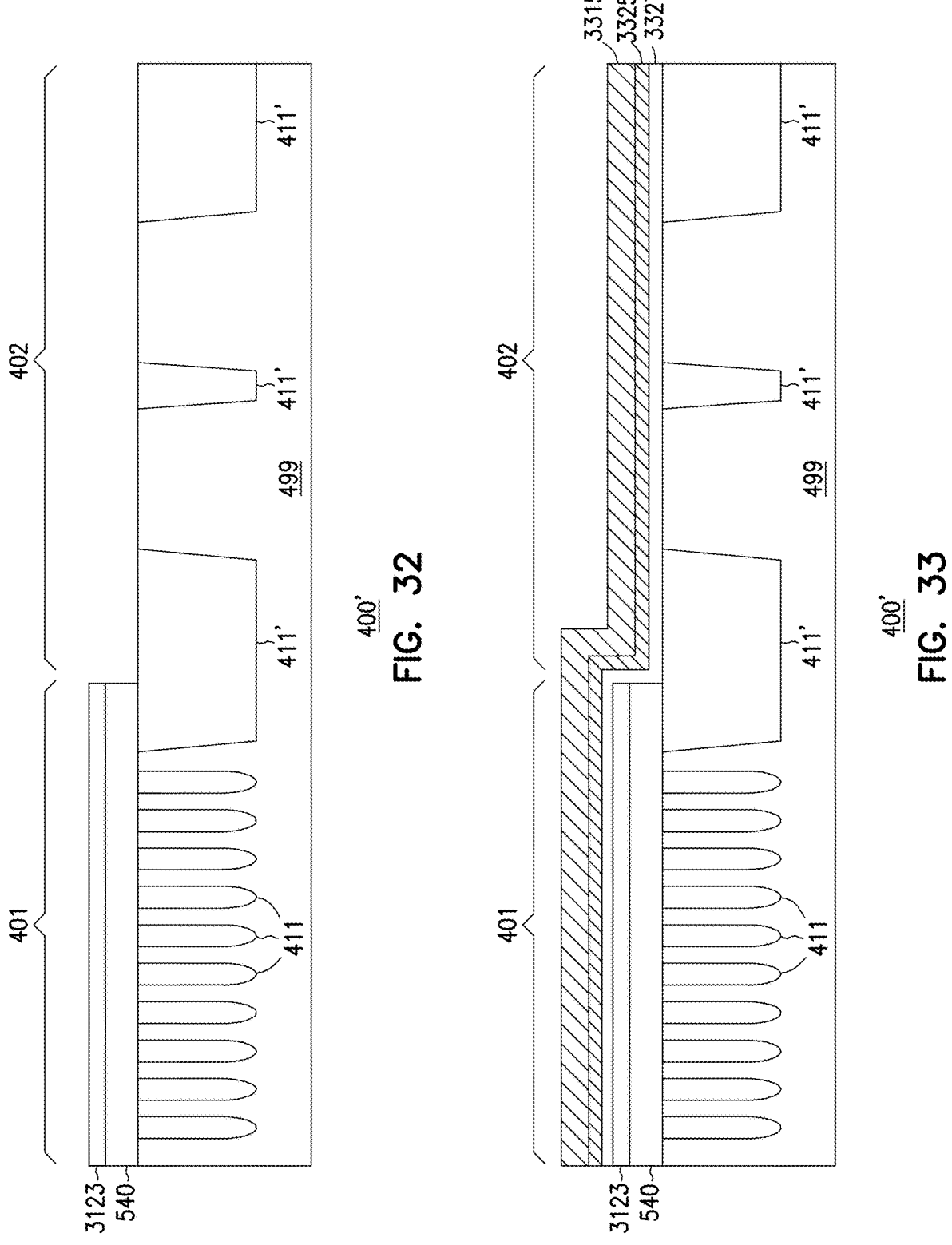

MEMORY DEVICE INCLUDING STRUCTURES IN MEMORY ARRAY REGION AND PERIPERAL CIRCUITRY REGION

FIELD

Embodiments described herein relate to structures in a memory array region and a peripheral region of a memory device including processes of forming such structures.

BACKGROUND

Memory devices, such as dynamic random-access memory (DRAM) devices, have memory cells to store information and circuitry to support operations to store information in or read information from the memory cells. Forming such a memory device includes many processes that are performed sequentially one after another. Some of such processes are temperature dependent. Thus, thermal budget plays a key role in formation of some part of the memory device. Violation of such thermal budget can result in inferior device structure. Extreme thermal budget violation can lead to a defective memory device.

BRIEF DESCRIPTION OF THE DRAWINGS

FIG. 4 through FIG. 29 show different views of structures during processes of forming a memory device, according to some embodiments described herein.

FIG. 30 through FIG. 38 show different views of structures during processes of forming another memory device, according to some embodiments described herein.

DETAILED DESCRIPTION

The techniques described herein involve a memory device with improved structures associated with circuitry in a peripheral region of the memory device. The described memory device includes structures (e.g., gate stacks) associated with circuitry in the peripheral region of the memory device and structures (e.g., bit line stacks) in a memory array region of the memory device. In techniques described herein, the structures (e.g., gate stacks) in the peripheral region can be formed after the structures (e.g., bit line stacks) in the memory array region are formed. The techniques described herein can improve thermal budget for formation of structures in the peripheral region. This leads to an improvement in the structures (e.g., gate stacks) in the peripheral region. Other improvements and benefits of the described techniques are further discussed below with reference to FIG. 1 through FIG. 38.

Figure 1:
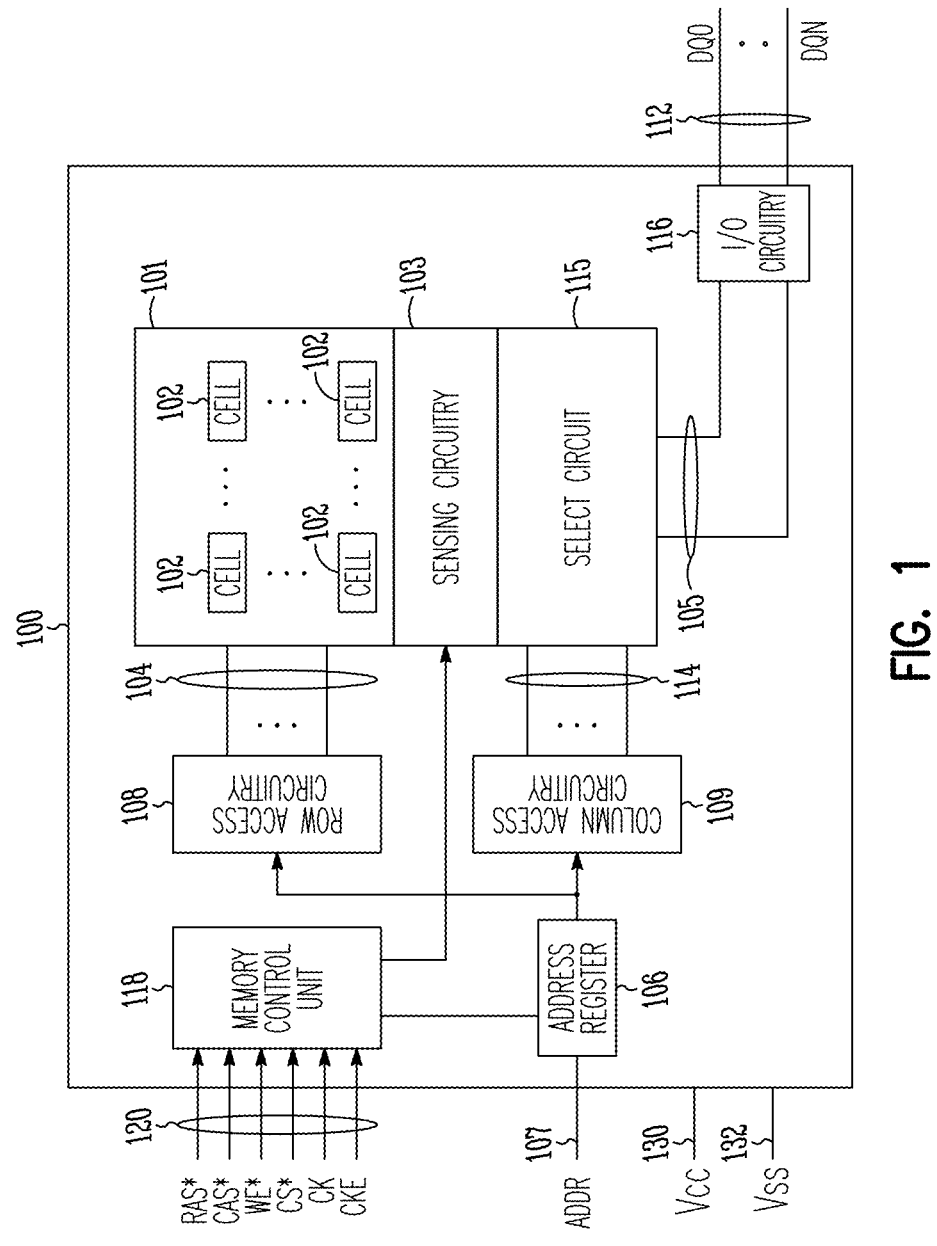
FIG. 1 shows an apparatus in the form of a memory device, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include a transistor and a storage element (store device). The storage element can include a capacitor or other storage elements different from a capacitor. The structure of memory array 101, including memory cells 102, can include the structure of memory arrays and memory cells described below with reference to FIG. 2 through FIG. 38.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., to be written to or programed in) or read (e.g., sensed) from memory cells 102.

Memory device 100 can include an address register 106 to receive address information ADDR (e.g., row address signals and column address signals) on lines 107 (e.g., address lines). Memory device 100 can include row access circuitry 108 (e.g., X-decoder) and column access circuitry 109 (e.g., Y-decoder) that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2 through FIG. 38.

Figure 2:
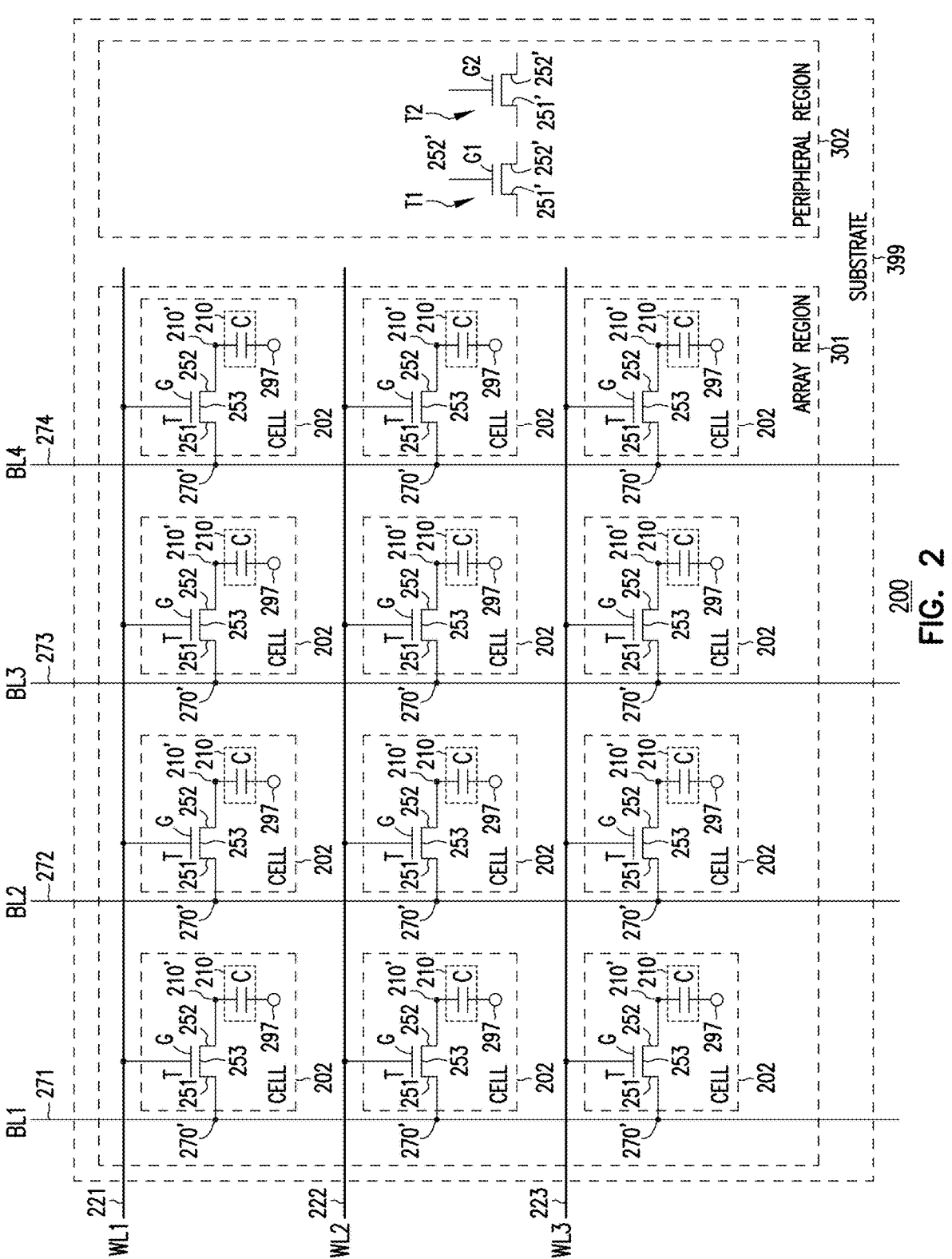
FIG. 2 shows a schematic of a memory device having a memory array region including memory cells and control gates of the memory cells, and a peripheral region having transistors, according to some embodiments described herein.

FIG. 2 shows a schematic diagram of a portion of a memory device 200 including regions 301 and 302, according to some embodiments described herein. Memory device 200 can correspond to memory device 100 of FIG. 1. For example, region 301 can include a memory array (or memory arrays) like memory array 101 of FIG. 1. Region 302 can include circuitry (e.g., peripheral circuitry) of memory device 200 that can include sense amplifiers, page buffers, and decoders of memory device 200. For example, part of region 302 can include part of circuitry similar to sensing circuitry 103, select circuitry 115, I/O circuitry 116, row access circuitry 108, and column access circuitry 109 of memory device 100 of FIG. 100. As shown in FIG. 2, regions 301 and 302 can be formed in (e.g., formed on) a substrate (e.g., substrate 399 in FIG. 3A and FIG. 3B) of memory device 200.

As shown in FIG. 2, memory device 200 can include memory cells 202, data lines (e.g., bit lines) 271, 272, 273, and 274, and access lines (e.g., word lines) 221, 222, and 223. For simplicity, FIG. 2 shows 12 memory cells 202, four data lines 271, 272, 273, and 274, and three access lines 221, 222, and 223. However, memory device 200 can include numerous memory cells, data lines, and access lines.

Memory cells 202 include volatile memory cells (e.g., DRAM cells). For simplicity, similar or identical elements among memory cells 202 are given the same labels. Each of memory cells 202 can include a transistor T (e.g., access transistor) and a charge storage structure (e.g., memory element) 210. Transistor T can include a field-effect transistor (FET). As an example, transistor T can be an n-channel FET (NFET). Thus, transistor T can include an operation similar to that of an n-channel metal-oxide semiconductor (NMOS) transistor. Alternatively, transistor T can be a p-channel FET (PFET) that can include an operation similar to that of a p-channel metal-oxide semiconductor (PMOS) transistor.

FIG. 2 shows charge storage structure 210 including a capacitor C as an example. However, charge storage structure 210 can include another type of storage element different from a capacitor. As shown in FIG. 2, charge storage structure 210 can be coupled to transistor T (e.g., coupled to drain 252 of transistor T) through a conductive contact (e.g., capacitor contact) 210'. Charge storage structure 210 can also be coupled to a node 297. Node 297 can be part of a ground connection memory device 200. Alternatively, node 297 can be coupled to a voltage source different from ground. In the example of FIG. 2, capacitor C can include one terminal (e.g., a capacitor plate) coupled to conductive contact 210' and another terminal (e.g., another capacitor plate) coupled to node 297. Charge storage structure 210 can form the memory element of a respective memory cell among memory cells 202. Charge storage structure 210 can store charge. The value (e.g., "0" or "1") of information stored in a particular memory cell among memory cells 202 can be based on the amount of charge stored in charge storage structure 210 (e.g., stored in capacitor C) of that particular memory cell.

As shown in FIG. 2, transistor T can include a control gate G and regions (e.g., source and drain regions) 251 and 252. In this description, "source" and "drain" are used interchangeably. Thus, region 251 can be called source region or source 251 of transistor T and region 252 can be called drain region or drain 252 of transistor T. Alternatively, region 251 can be called drain region or drain 251 of transistor T and region 252 can be called source region or source 252 of transistor T. As shown in FIG. 2, transistor T can also include a channel 253 between source 251 and drain 252. In operation, a current can flow in a conductive path (e.g., current path) 360 (labeled in FIG. 3B) between source 251 and drain 252 through channel 253.

Data lines 271, 272, 273, and 274 (which can include bit lines) can carry respective signals (e.g., bit line signals) BL1, BL2, BL3, and BL4. Each memory cell 202 can be coupled to a respective data line among data lines (e.g., bit lines) 271, 272, 273, and 274 through a conductive contact (e.g., bit line contact) 270'. Conductive contact 270' can be coupled to drain 252 of a respective transistor T. During a read operation, memory device 200 can use data lines 271, 272, 273, and 274 to obtain information read (e.g., sensed) from selected memory cells 202. During a write operation, memory device 200 can use data lines 271, 272, 273, and 274 to provide information to be stored in selected memory cells 202. During an operation (e.g., read or write operation) of memory device 200, a circuit path (e.g., current path) can be formed between a respective data line (among data lines 271, 272, 273, and 274) and charge storage structure 210 of a particular memory cell (e.g., a selected memory cell 202) through source, drain, and channel 251, 252, and 253, respectively, of transistor T of the particular memory cell.

Access lines 221, 222, and 223 (which can include word lines) can carry respective signals (e.g., word line signals) WL1, WL2, and WL3. Memory device 200 can use access lines 221, 222, and 223 to selectively access memory cells 202 (selected memory cells 202). Control gates G of different transistors T in a row (e.g., four transistors T in the same row from left to right in FIG. 2) can be coupled to (e.g., can share) the same access line associated with that row. In a physical structure of memory device 200, access lines 221, 222, and 223 are structured as a conductive line that includes a conductive structure. Control gate G of a respective transistor T is part of (a portion of) the conductive structure of a respective access line, as described in more detail with reference to FIG. 3A through FIG. 3C.

As shown in FIG. 2, region 302 can include transistors T1 and T2 having respective source 251' and drains 252' and respective gates G1 and G2. Transistors T1 and T2 can be part of circuitry (e.g., peripheral circuitry) of memory device 200. For simplicity only a portion of the circuitry in region 302 is shown in FIG. 2.

Figure 3A:
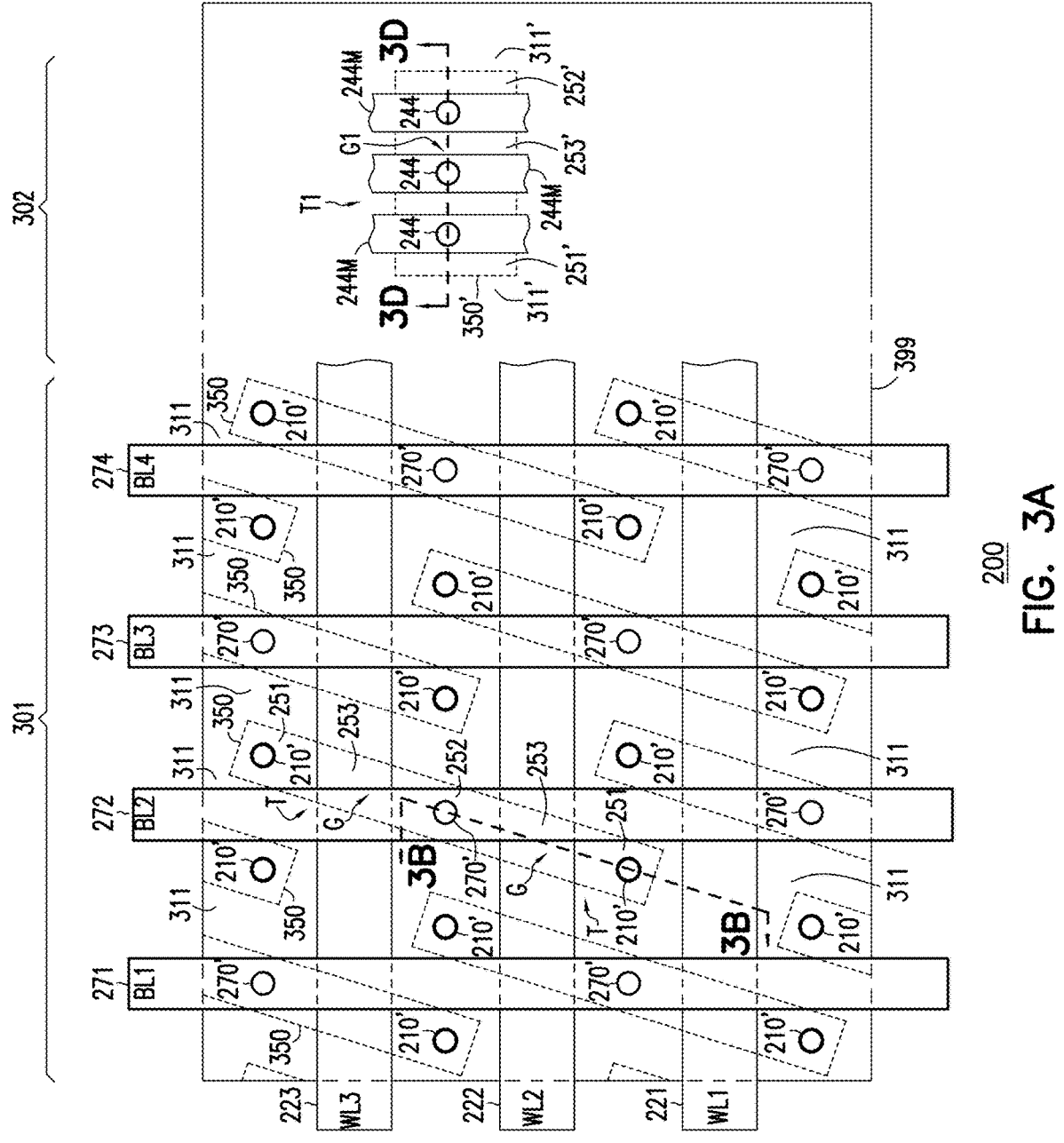
FIG. 3A, FIG. 3B, FIG. 3C, and FIG. 3D show different views of a structure of a portion of the memory device of FIG. 2, according to some embodiments described herein.
Figure 3B:
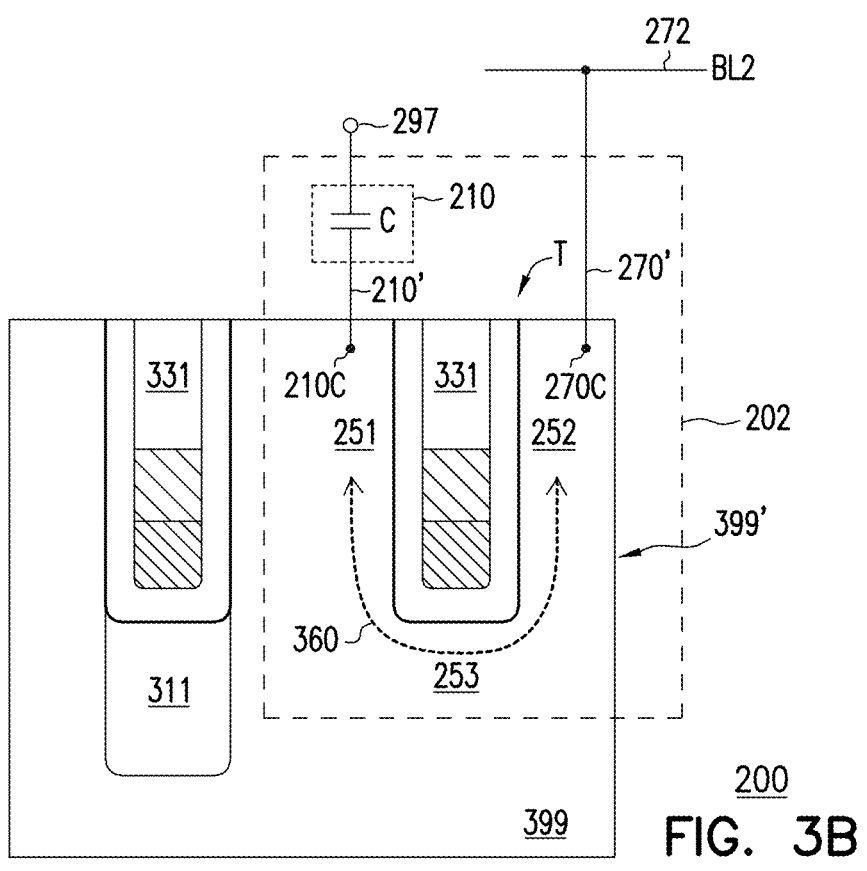
Figure 3C:
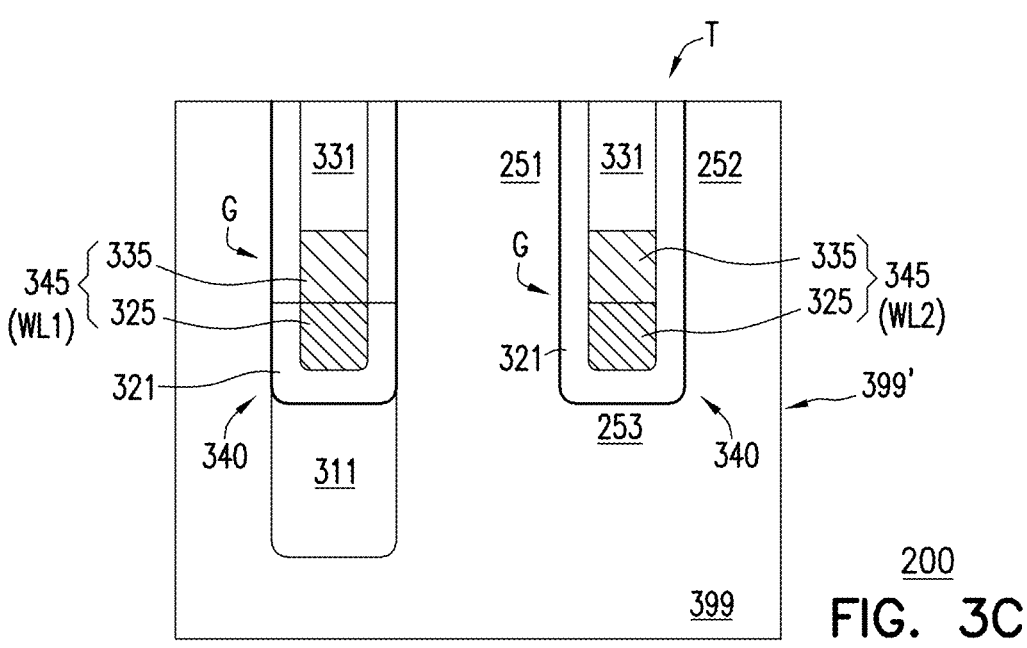
Figure 3D:
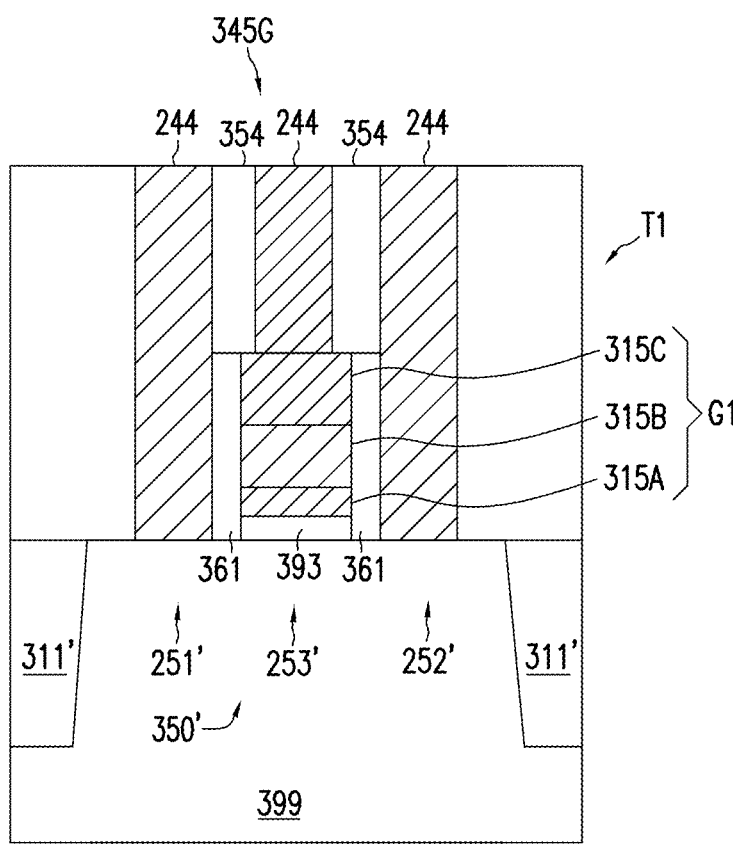

FIG. 3A, FIG. 3B, FIG. 3C, and FIG. 3D show different views of a structure of a portion of memory device 200 of FIG. 2, according to some embodiments described herein. FIG. 3A shows a top view (e.g., a layout) of a structure of a portion of memory device 200 (schematically shown in FIG. 2). FIG. 3B shows a side view (e.g., a cross-section) of memory device 200 along line (e.g., sectional line) 3B-3B of FIG. 3A. FIG. 3C shows the same view as FIG. 3B without charge storage structure 210, data line 272 and with additional labels for the structure of transistor T and labels for a conductive structure of access line 222 (associated with signal WL2). FIG. 3D shows a side view (e.g., a cross-section) of memory device 200 along line (e.g., sectional line) 3D-3D in region 302 of memory device 200 of FIG. 3A.

For simplicity, cross-sectional lines (e.g., hatch lines) are omitted from most of the elements shown in FIG. 3A, FIG. 3B, FIG. 3C, FIG. 3D and other figures (e.g., FIG. 4 through FIG. 38) in the drawings described herein. Some elements of memory device 200 may be omitted from a particular figure of the drawings so as to not obscure the description of the element (or elements) being described in that particular figure. Some similar or the same elements in a particular figure are not labeled to avoid crowding that particular figure. The dimensions (e.g., physical structures) of the elements shown in the drawings described herein are not scaled.

As shown in FIG. 3A, memory device 200 can include a substrate 399, regions (e.g., active regions) 350 formed in substrate 399, and isolation structures 311 formed in substrate 399. Substrate 399 can include a semiconductor substrate (e.g., a silicon-based substrate). Each region 350 can be a doped region in the material 399' in substrate 399. Material 399' can include semiconductor material (e.g., a silicon or silicon-based material) or other conductive materials. Isolation structures 311 can include a dielectric material (e.g., silicon dioxide) formed between adjacent regions 350 to electrically isolate regions 350 from each other. An example of isolation structures 311 include shallow trench isolation (STI) structures.

As shown in FIG. 3A, data lines 271, 272, 273, and 274 can have respective lengths extending in a direction (e.g., from top to bottom of FIG. 3A) perpendicular to the direction (e.g., from left to right of FIG. 3A) the lengths of access lines 221, 222, and 223. Data lines 271, 272, 273, and 274 can be formed in a level (physical level) of memory device 200 that is over (above) the level (physical level) of access lines 221, 222, and 223.

Regions 350 (from a top view shown in FIG. 3A) can be formed in material 399' of substrate 399 such that regions 350 can be at slanted positions with respect to the lengths of data lines 271, 272, 273, and 274 and the lengths of access lines 221, 223, and 223. Each region 350 can include source, drain, and channel 251, 252, and 253, respectively, of two transistors T (adjacent transistors T) of two respective memory cells 202 (not labeled in FIG. 3A). Drain 252 in a particular region 350 can be shared by the two adjacent transistors T (of two memory cells) in that particular region 350.

FIG. 3A also shows conductive contacts 210' coupled to respective regions 350. Each conductive contact 210' can be coupled to source 251 of a respective transistor T and a respective capacitor C (as shown and described above with reference to FIG. 2). For simplicity, FIG. 3A does not show capacitors Cs of memory cells 202. In an example structure of memory device 200, at least a portion of capacitors Cs (e.g., conductive regions (e.g., conductive plates) of capacitors Cs) can be formed over (above) data lines 271, 272, 273, and 274.

FIG. 3A also shows conductive contacts (e.g., bit line contacts) 270' coupled to respective regions 350 to make an electrical contact with respective regions 350. As shown in FIG. 3A, each conductive contact 270' can be coupled to a drain 252 of a respective transistor T and to a respective data line among data lines 271, 272, 273, and 274 (as described above with reference to FIG. 2).

As shown in FIG. 3A, FIG. 3B, and FIG. 3C, each access line 221, 222, or 223 can extend through respective regions 350 and respective isolation structures 311. Control gate G of a particular transistor T can be part of (a portion of) a respective access line located over (e.g., directly over) channel 253 of that a particular transistor T.

As shown in FIG. 3A, substrate 399 can include a region (e.g., active regions) 350' in region (e.g., peripheral region) 302. Source 251', drain 252', and channel 253' of transistor T1 can be located in region 350'. Source 251', drain 252', and gate G1 can be coupled to respective conductive contacts 244, which can be coupled to respective conductive lines (e.g., metal lines) 244M. Region 302 can include isolation structures 311' located in substrate 399 and on both sides (e.g., left and right sides) of region 350'. A side view (e.g., a cross-section) of memory device 200 along line 3D-3D in region 302 is shown in FIG. 3D.

FIG. 3B shows a side view of memory device 200 along line (e.g., 3B-3B of FIG. 3A. As shown in FIG. 3A, line 3B-3B cuts through a portion of access line 221 formed in isolation structures 311, and a portion of access line 222 (e.g., control gate G of transistor T) formed in a portion of region 350. In FIG. 3B, for simplicity, charge storage structure 210 (which can include capacitor C), data line 272, and conductive contacts 210' and 270' are schematically (instead of structurally) shown. As shown in FIG. 3B, source, drain, and channel 251, 252, and 253, respectively, can be included in (e.g., formed in) respective portions of material 399' of substrate 399. The portions that include source, drain, and channel 251, 252, and 253, respectively, can be included in region (e.g., active region) 350 (labeled in FIG. 3A). FIG. 3B also shows conductive path (e.g., current path) 360 between source 251 and drain 252 through channel 253 that can be created during an operation (e.g., a read or write operation) of memory device 200.

As shown in FIG. 3B, conductive contact 210' (coupled to charge storage structure 210) can be formed such that it can contact (e.g., be directly coupled to) source 251 in region 350 (labeled in FIG. 3A) in substrate 399 at a location (e.g., capacitor contact location) 210C to make an electrical contact with source 251.

As shown in FIG. 3B, conductive contact 270' (coupled to data line 272) can be formed such that it can contact (e.g., be directly coupled to) drain 252 in region 350 (labeled in FIG. 3A) in substrate 399 at a location (e.g., bit line contact location) 270C to make an electrical contact with drain 252. FIG. 3B also shows the location of isolation structure 311 (under the access line associated with signal WL1 in FIG. 3A).

FIG. 3C shows a cross-section of a conductive structure 345 formed in a respective recess 340. Recesses 340 can be formed in material (e.g., semiconductor material) 399' of substrate 399. Each recess 340 can be a trench formed in material 399' of substrate 399 such that substrate 399 is void of the material 339' in each recess 340.

As shown in FIG. 3C, conductive structure 345 can include a conductive portion 325 and a conductive portion 335 formed in recess 340. Conductive portion 335 can be formed over (e.g., formed on) conductive portion 325 in recess 340. Conductive structure 345 is part of a respective access line (e.g., word line associated with signal WL1 or WL2). Conductive structure 345 can form control gate G of transistor T. Thus, control gate G of transistor T can include conductive portions 325 and 335 of conductive structure 345. Conductive structure 345 (both conductive portions 325 and 335) can extend (e.g., run) continuously along the length of a respective access line. Conductive portions 325 and 335 of conductive structure 345 can include different conductive materials. For example, conductive portion 325 can include a conductive material, which can include metal, metal-based material, or combinations of different conductive materials. In another example, conductive portion 335 can include a conductive material, which can include poly-silicon (e.g., conductively doped polysilicon (e.g., N+ poly-silicon)), other conductive materials, or a combination of conductive materials.

As shown in FIG. 3C, source 251 of transistor T can be a portion of material 399' on one side (e.g., left side) of a conductive structure 345. Drain 252 of transistor T can be a portion of material 399' on another side (e.g., right side) of conductive structure 345 opposite from the side where source 251 is located. Channel 253 can be a portion of material 399' on another side (e.g., bottom side) of conductive structure 345 that connects source 251 and drain 252.

As shown in FIG. 3C, memory device 200 can include a dielectric structure 331, which can form (e.g., is part of) a gate dielectric structure (e.g., gate oxide) associated with control gate G of transistor T of a respective memory cell 202 (FIG. 2). Dielectric structure 331 can be a "U" shape dielectric liner formed in recess 340 to electrically isolate conductive structure 345 (conductive portions 325 and 335) from material (e.g., semiconductor material) 399. Isolation structure 311 can be silicon dioxide or other dielectric materials (e.g., high-k dielectric materials).

FIG. 3D shows a side view of memory device 200 along line 3D-3D in region 302 of FIG. 3A. As shown in FIG. 3D, transistor T1 can include a structure (e.g., gate stack) 345G over channel 253' and between source 251' and drain 252'. Structure 345G can include a stack (e.g., gate stack) that includes different conductive materials (e.g., different layers of conductive materials) 315A, 315B, and 315C. Conductive materials 315A, 315B, and 315C can form part of gate G1 of transistor T1. Conductive materials 315A, 315B, and 315C can include metal, conductively doped polysilicon, and metal, respectively. However, conductive materials 315A, 315B, and 315C can include other combinations of conductive materials. FIG. 3D shows gate G1 including three layers of conductive materials as an example. Alternatively, gate G1 can include fewer or more than three layers of conductive materials. As shown in FIG. 3D, conductive contacts 244 can include respective materials (e.g., metal) extending vertically and contacting respective source and drain channel 251', 252', and gate G1. Conductive contacts 244 coupled to respective source and drain 251' and 252' can be called source/drain conductive contacts. Conductive contact 244 coupled to gate G1 can be called a gate conductive contact. Conductive lines 244M (shown in FIG. 3A), which are omitted from FIG. 3D for simplicity, can be formed over and coupled to respective conductive contacts 244.

Memory device 200 can be formed using processes similar to or the same as the processes of forming memory device 400 described below.

FIG. 4 through FIG. 29 show different views of structures during processes of forming memory device 400, according to some embodiments described herein. Some or all of the processes used to form memory device 400 can be used to form memory device 200 described above with reference to FIG. 2 through FIG. 3D.

Figures 4, 5:
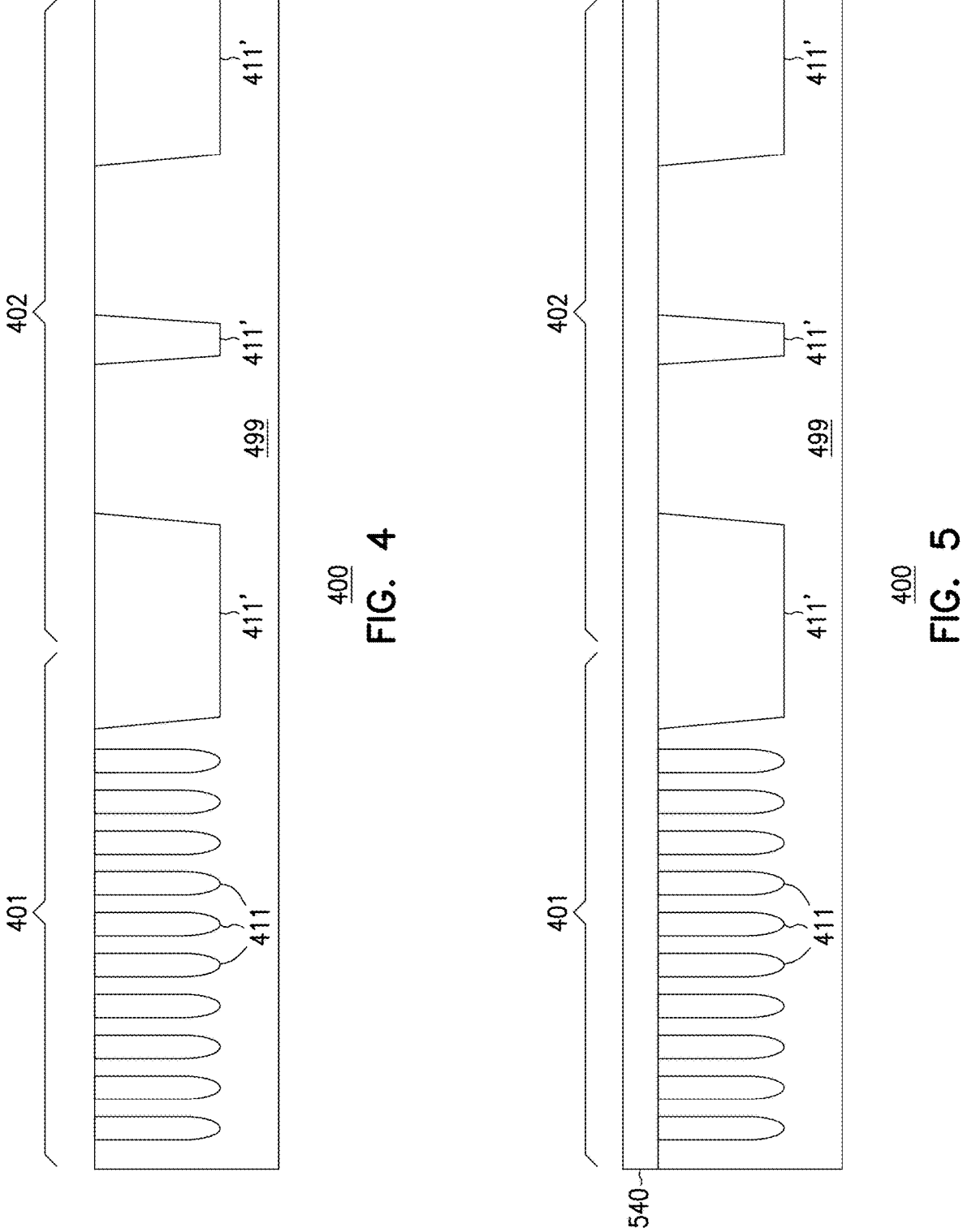

FIG. 4 shows memory device 400 after isolation structures 411 and 411' are formed in respective regions 401 and 402 of a substrate 499 of memory device 400. Regions 401 and 402 can be similar to or the same as region 301 and 302, respectively, of memory device 200 (FIG. 2 through FIG. 3C). For example, after memory device 400 is formed (completed), region 401 (FIG. 4) can include memory array region that includes memory cells like memory cells 202 of memory device 200 (FIG. 2 through FIG. 3C) after memory device 400 is formed (completed). After memory device 400 is formed (completed), region 402 (FIG. 4) can include a peripheral region that includes circuitry like circuitry (e.g., sense amplifiers, page buffers, and decoders including transistors T1 and T2) of memory device 200 (FIG. 2 through FIG. 3D).

In FIG. 4, substrate 499 can be similar to or the same as substrate (e.g., semiconductor substrate) 399 of memory device 200 (FIG. 2 through FIG. 3C). Isolation structures 411 and 411' can include dielectric materials (e.g., silicon dioxide). Isolation structure 411 can be similar to or the same as isolation structures 311 between regions (e.g., active regions) 350 in region 301 (e.g., memory array region) (FIG. 3A, FIG. 3B, and FIG. 3C) of memory device 200. Isolation structure 411' can be similar to or the same as isolation structures 311' between region (e.g., active regions) 350' in region (e.g., peripheral region) 302 (FIG. 3A and FIG. 3B, and FIG. 3C) of memory device 200.

For simplicity and so as to not obscure the embodiments (e.g., processes) described herein, FIG. 4 shows only a portion of region 401 and only a portion of region 402 of memory device 400. However, region 401 can include additional structure (e.g., located on left of region 401 in FIG. 4) that is similar to the structure of region 401 shown in FIG. 4. Portion of region 402 also includes additional structure (e.g., located on the right of region 402 in FIG. 4) that is similar to the structure of region 402 shown in FIG. 4. Further, for simplicity, FIG. 4 does not show additional structures that may already be formed in region 401 of substrate 499 of FIG. 4. Such additional structures can include elements like access lines (e.g., word lines) 221, 222, and 223 in FIG. 3A and FIG. 3B and corresponding control gates G of memory device 200.

FIG. 5 shows memory device 400 after dielectric material 540 is formed (e.g., deposited) over other materials in regions 401 and 402. Dielectric material 540 can include silicon dioxide. Dielectric material 540 can be formed by atomic layer deposition (ALD) process.

Figures 6, 7:
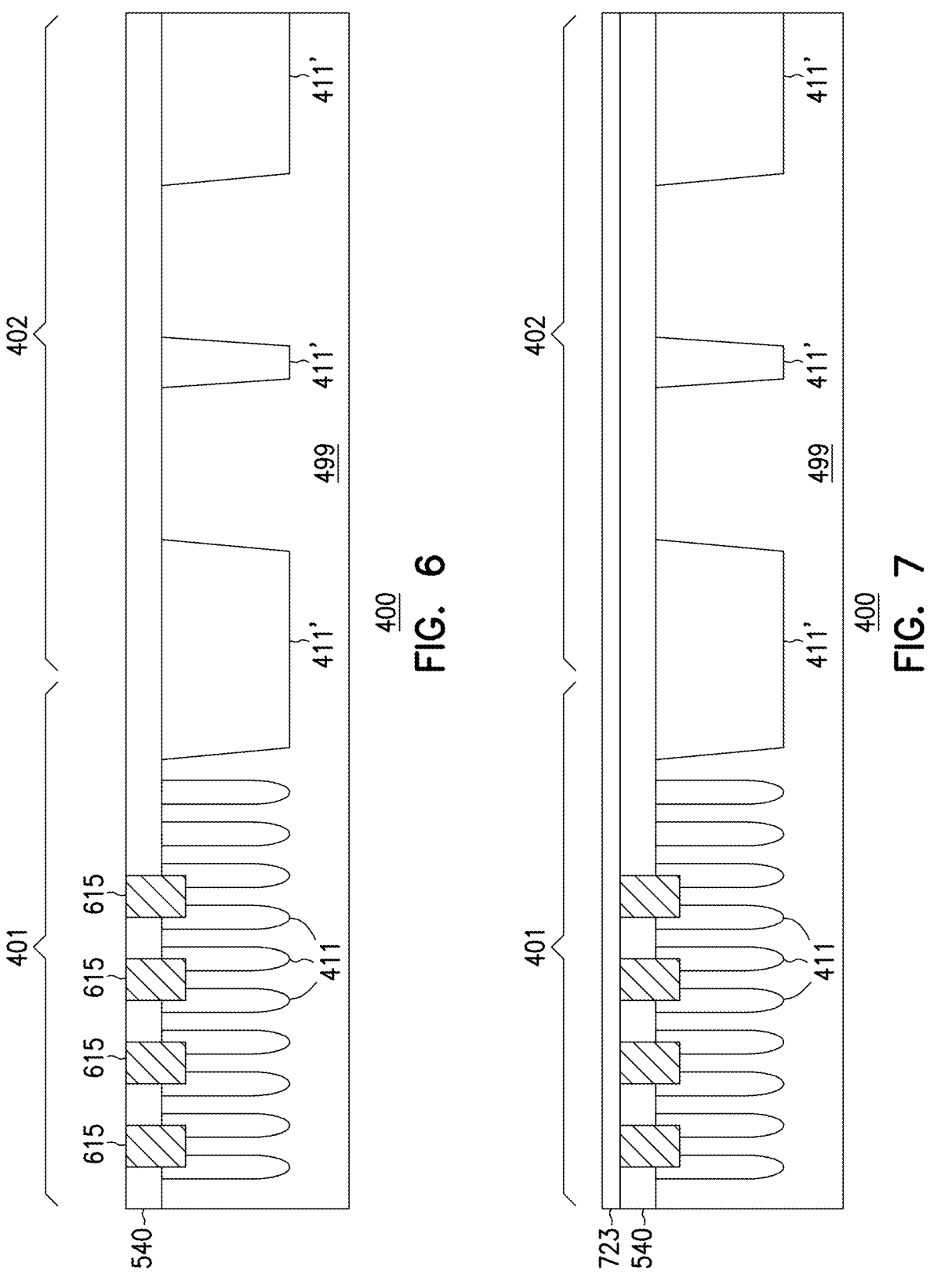

FIG. 6 shows memory device 400 after a conductive material 615 is formed through respective portions of dielectric material 540 in region 401. In subsequent processes, conductive material 615 can be structured to form part of conductive contacts for respective data lines (e.g., bit lines) like data lines 271, 272, 273, and 274 of memory device 200 (FIG. 3A and FIG. 3B). As shown in FIG. 6, conductive material 615 can contact respective regions (not labeled) in substrate 499. These regions in substrate 499 can be similar to or the same as a region at location 270C (FIG. 3B) of conductive contacts (e.g., bit line contact) 270' (FIG. 3A) of memory device 200. In FIG. 6 forming conductive material 615 can include removing (e.g., etching) respective portions of dielectric material 540 to form openings (not labeled) in dielectric material 540 (at locations of conductive materials 615 in region 401), and then forming (e.g., depositing) conductive material 615 at the openings. Conductive material 615 can include conductively doped polysilicon or other conductive materials. The processes associated with FIG. 6 can include a process (e.g., an implant process) to introduce impurities into regions (e.g., active regions) between isolations structures 411'.

FIG. 7 shows memory device 400 after a dielectric material 723 is formed (e.g., deposited) over conductive materials 615 and dielectric material 540 in respective regions 401 and 402. Dielectric material 723 can include silicon nitride. Dielectric material 723 can protect the materials (which are under dielectric material 723) from the subsequent processes forming materials (e.g., materials 927, 1025, and 1115 FIG. 9, FIG. 10, and FIG. 11, respectively) in region 402.

Figures 8, 9:
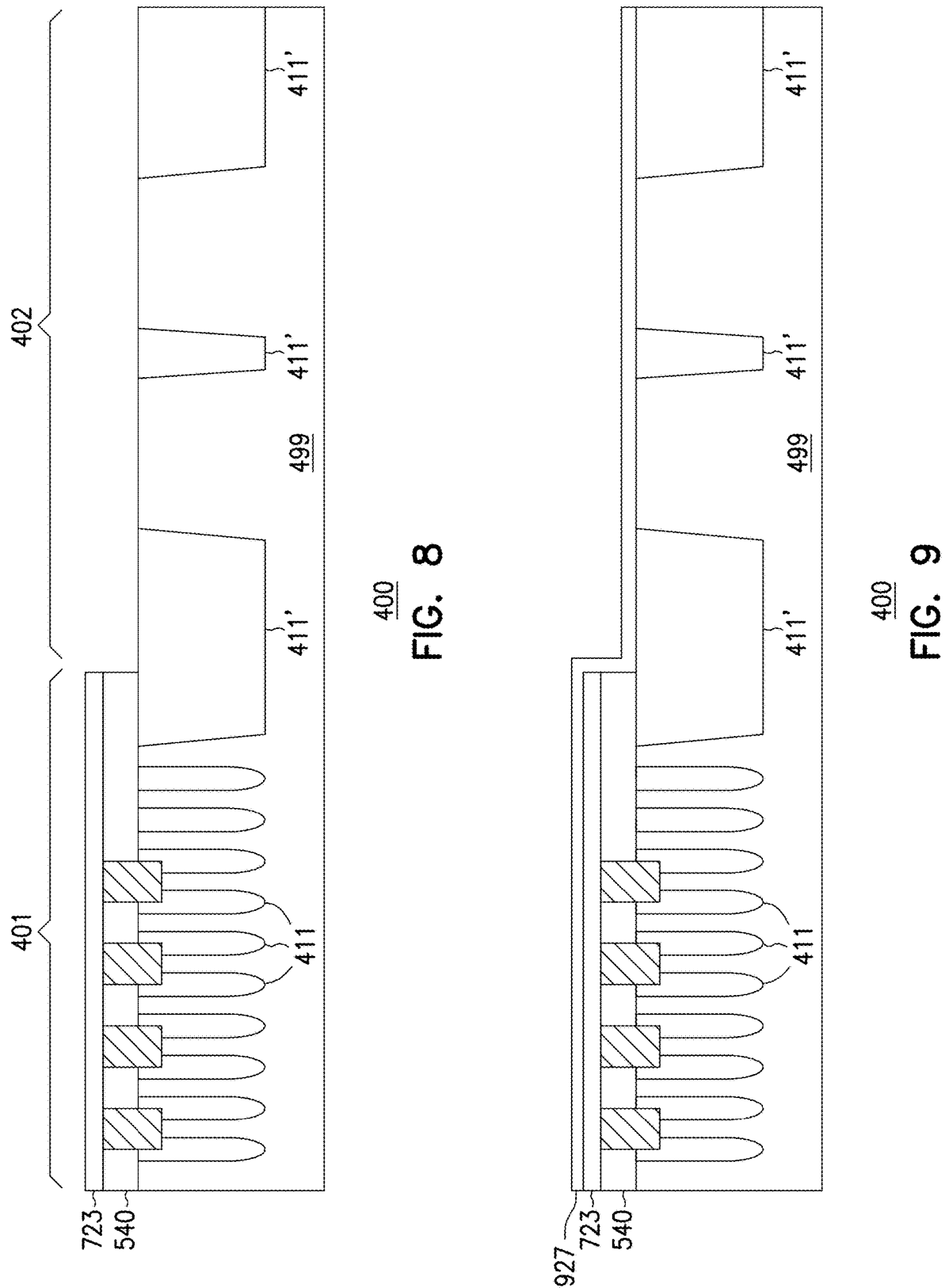

FIG. 8 shows memory device 400 after a portion of each of dielectric materials 723 and 540 in region 402 is removed. A remaining portion of each of dielectric materials 723 and 540 in region 401 is shown in FIG. 8. The processes associated with FIG. 8 can include a process (e.g., an implant process) to introduce dopants into regions (e.g., P-well and N-well) between isolation structures 411' in substrate 499'.

FIG. 9 shows memory device 400 after a dielectric material 927 is formed (e.g., deposited) over other materials in regions 401 and 402. Dielectric material 927 can include a high-k dielectric material or other dielectric materials.

Figures 10, 11:
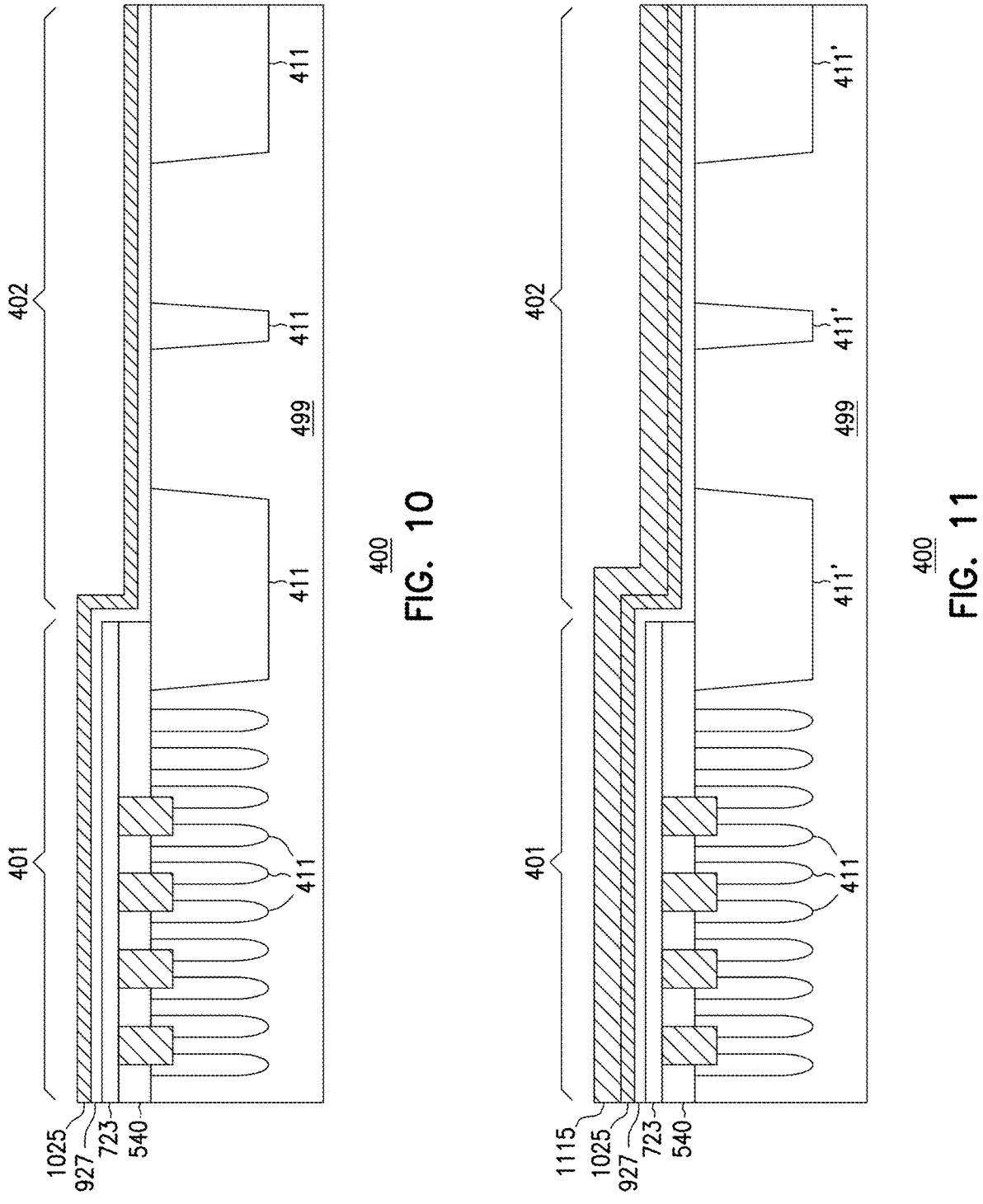

FIG. 10 shows memory device 400 after a conductive material 1025 is formed over dielectric material 927 in regions 401 and 402. Conductive material 1025 can include metal or other conductive materials.

FIG. 11 shows memory device 400 after a conductive material 1115 is formed over conductive material 1025 in regions 401 and 402. Conductive material 1115 can include conductively doped polysilicon or other conductive materials.

Figures 12, 13:
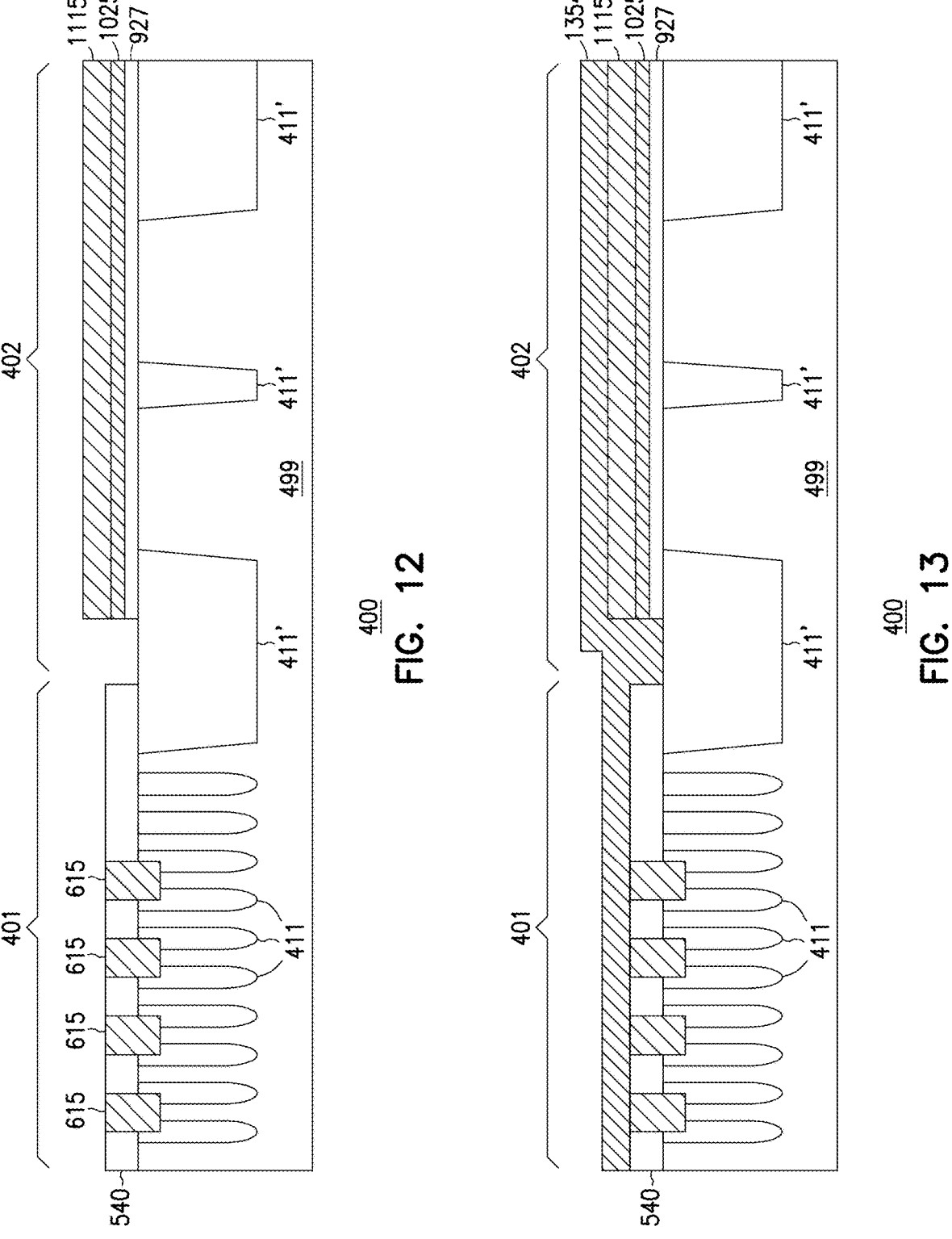

FIG. 12 shows memory device 400 after a portion of each of conductive material 1125, conductive material 1025, dielectric material 927, and dielectric material 723 in region 401 is removed. As shown in FIG. 12, conductive material 615 is exposed at region 401.

FIG. 13 shows memory device 400 after a conductive material 1354 is formed over materials in regions 401 and 402. Conductive material 1354 can include metal (e.g., tungsten) or other conductive materials.

Figures 14, 15:
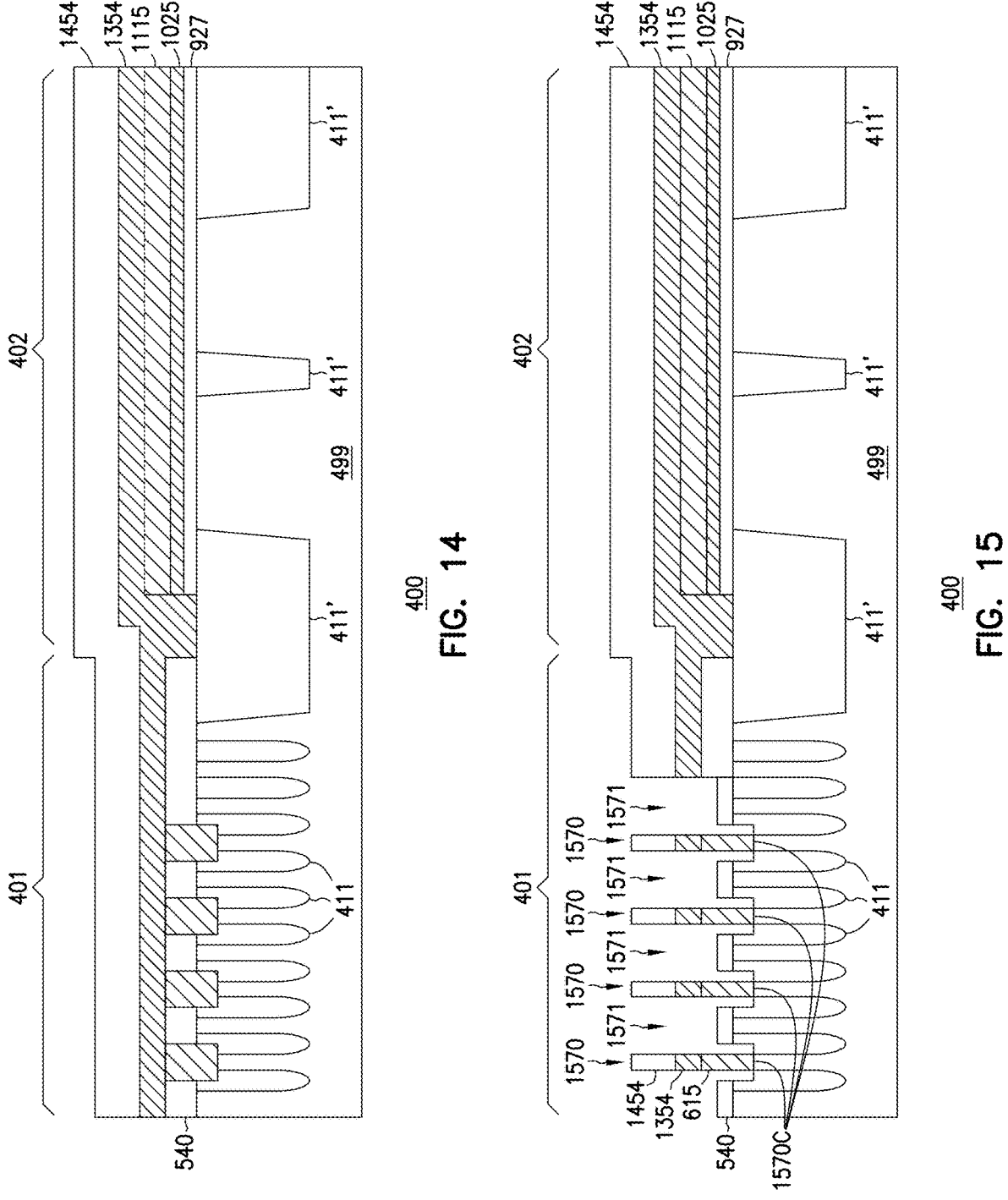

FIG. 14 shows memory device 400 after a dielectric material 1454 is formed (e.g., deposited) over conductive material 1354 in regions 401 and 402. Dielectric material 1454 can include silicon nitride or other dielectric materials.

FIG. 15 shows memory device 400 after structures (e.g., bit line stacks) 1570 are formed in region 401. Forming structures 1570 can include removing (e.g., pattering) part of each of dielectric material 1454, conductive material 1354, conductive material 615 from locations 1571 in region 401 to form separate portions of conductive material 1354 in region 401. Each of structures 1570 can include respective remaining portions of dielectric material 1454, conductive material 1354, and conductive material 615.

In FIG. 15, each location 1570C can be similar to or the same as location (e.g., bit line contact location) 270C of memory device 200 in FIG. 3B. In FIG. 15, each conductive material 615 can contact (can be directly coupled to) a particular region in substrate 499 at location 270C to make an electrical contact with that particular region (which can be similar to a drain of an active region like drain 252 of region 350 in FIG. 3A).

Conductive material 1354 and conductive material 615 in structures 1570 are part of respective data lines (e.g., bit lines) and conductive contacts (e.g., bit line contacts) for the data lines of memory device 400 (like data lines 271, 272, 273, and 274 of memory device 200 (FIG. 3A and FIG. 3B). For example, in FIG. 15, conductive material 1354 at respective structures 1570 can be part of respective data lines of memory device 400 (like data lines 271, 272, 273, and 274 of memory device 200 in FIG. 3A and FIG. 3B). In another example, conductive material 615 at respective structures 1570 can be part of respective conductive contacts for the data lines of memory device 400 (like conductive contacts 270' memory device 200 in FIG. 3A and FIG. 3B).

Figures 16, 17:
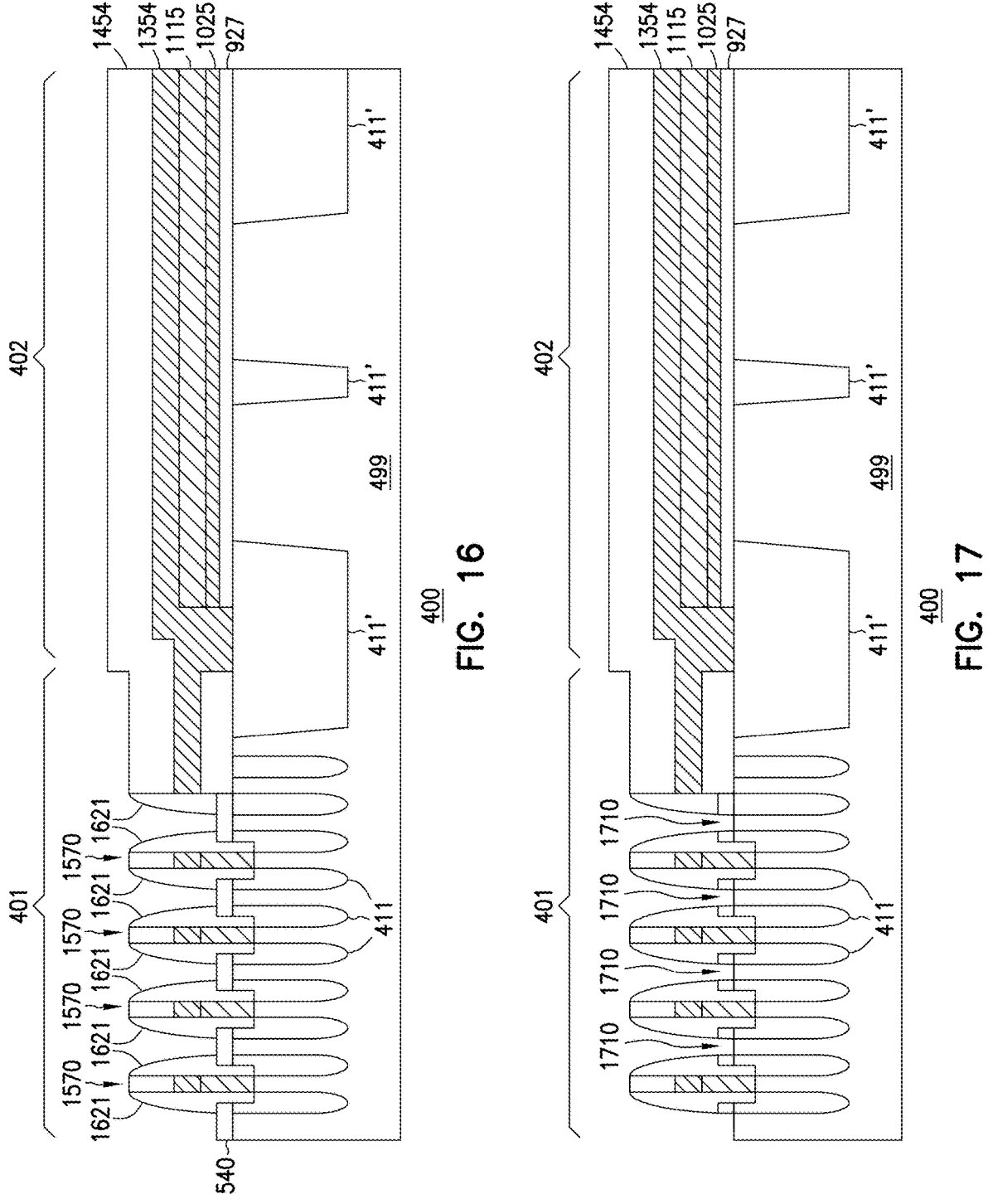

FIG. 16 shows memory device 400 after dielectric structures (e.g., bit line dielectric spacers) 1621 are formed on respective sides (e.g., left and right sides) of each structure 1570. Dielectric structures 1621 can include silicon dioxide or other dielectric materials. Dielectric structures 1621 can also be part of respective structures 1570. As shown in FIG. 15, structures 1570 are electrically separated from each other and can include respective stacks (e.g., bit line stacks) that include different conductive materials (e.g., conductive material 1354 and conductive material 615) in each stack.

FIG. 17 shows memory device 400 after respective portions of dielectric material 540 (labeled in FIG. 16) at locations 1710 (FIG. 17) in region 401 is removed. An etch (e.g., punch etch) process can be used in the processes associated with FIG. 17.

Figures 18, 19:
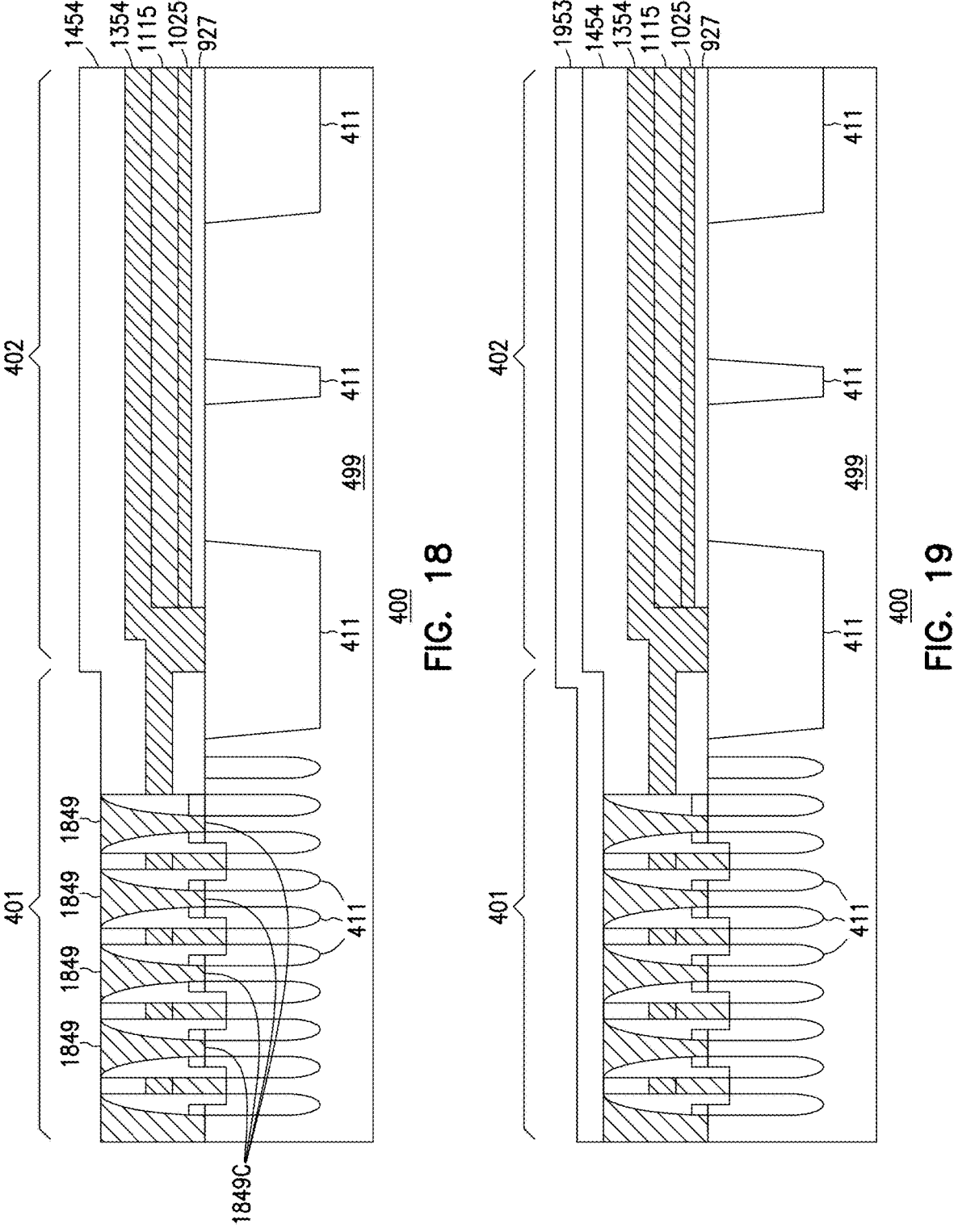

FIG. 18 shows memory device 400 after a conductive material 1849 is formed in locations 1710 (FIG. 17). Conductive material 1849 can include conductively doped polysilicon or other conductive materials. Conductive material 1849 can include respective portions formed between two adjacent structures 1570. As shown in FIG. 18, conductive material 1849 can contact respective regions in substrate 499 at locations 1849C. Each location 1849C can be similar to or the same as location (e.g., capacitor contact location) 210C of memory device 200 in FIG. 3B. In FIG. 18, conductive material 1849 can contact (can be directly coupled to) a particular region in substrate 499 at location 1849C to make an electrical contact with that particular region (which can be similar to a source of an active region like source 251 of region 350 in FIG. 3A).

FIG. 19 shows memory device 400 after a dielectric material 1953 is formed (e.g., deposited) over other materials in regions 401 and 402. Dielectric material 1953 can include silicon nitride or other dielectric materials.

Figures 20, 21:
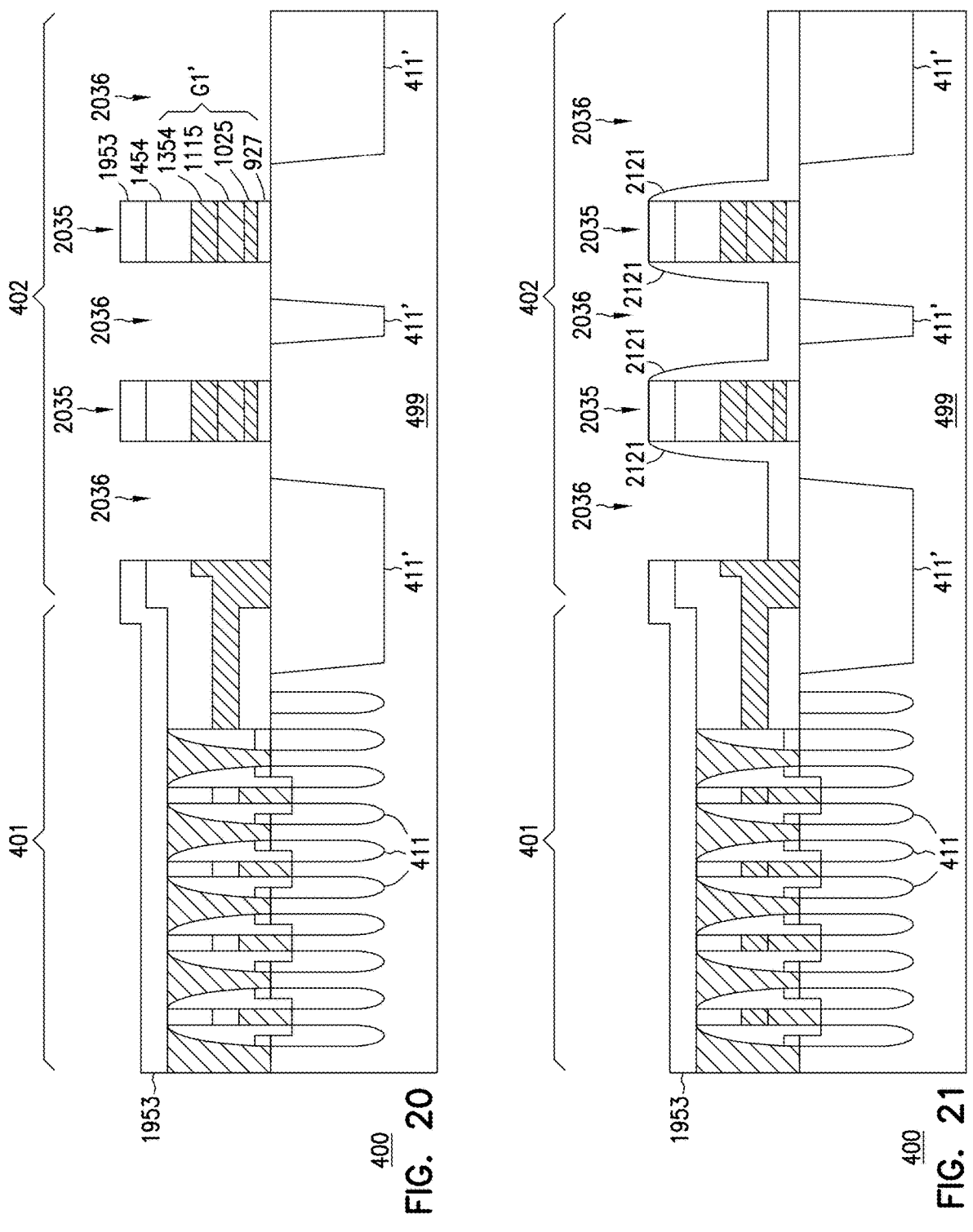

FIG. 20 shows memory device 400 after structures (e.g., gate stacks) 2035 are formed in region 401. Forming structures 2035 can include removing (e.g., pattering) part of each of the materials at locations 2036 to form separate portions of the remaining part of dielectric material (e.g., silicon nitride) 1953, dielectric material (e.g., silicon nitride) 1454, conductive material (e.g., metal) 1354, conductive material (e.g., polysilicon) 1115, conductive material (e.g., metal) 1025, and dielectric material (e.g., high-k dielectric material) 927. Each of structures 2035 can include respective portions of materials dielectric material 1953, dielectric material 1454, conductive material 1354, conductive material 1115, conductive material 1025, and dielectric material 927. Each structure 2035 can be part of a respective data line (e.g., bit line) like data lines 271, 272, 273, and 274 of memory device 200 (FIG. 3A and FIG. 3B). For example, in FIG. 20, each structure 2035 can be similar to or the same as structure 345G in region 302 of memory device 200 in FIG. 3D. As shown in FIG. 20, part of the material of substrate 499 and isolation structures 411' may be exposed at locations 2036.

FIG. 21 shows memory device 400 after dielectric structures (e.g., gate dielectric spacers) 2121 are formed on respective sides (e.g., left and right sides) of each structure 2035. Dielectric structures 2121 can include silicon dioxide or other dielectric materials. As shown in FIG. 21, part of the dielectric material that forms dielectric structures 2121 can also be formed over part of substrate 499 and isolation structures 411'. Dielectric structures 2121 can also be part of respective structures 2035. As shown in FIG. 21, structures 2035 are electrically separated from each other and can include respective stacks (e.g., gate stacks) that include different conductive materials (e.g., conductive material 1354, conductive material 1115, and conductive material 1025) in each stack. The conductive materials can form respective gates of transistors in region 402 of memory device 400 (e.g., like transistors T1 and T2 of memory device 200 in FIG. 3A and FIG. 3D).

The processes associated with FIG. 21 can include a process (e.g., lightly-doped-drain (LDD) implant process) to introduce dopants into regions between isolation structures 411' in region 402. The processes associated with FIG. 21 can include a process (e.g., stress process) performed to structures 2035 to improve channel mobility of circuitry associated with structures 2035.

Figures 22, 23:
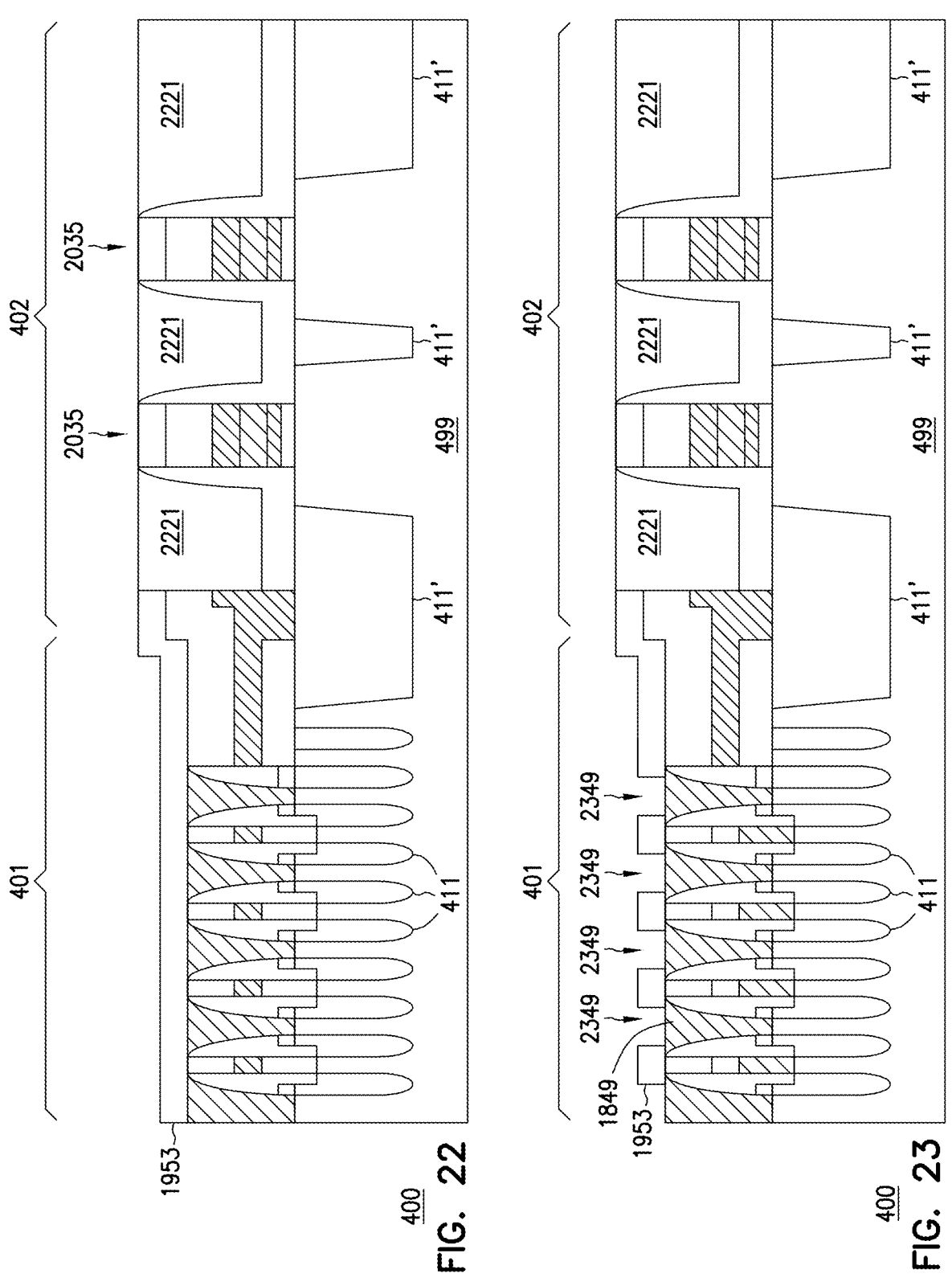

FIG. 22 shows memory device 400 after a dielectric material 2221 is formed in locations 2036 (FIG. 21). Dielectric material 2221 can include silicon dioxide or other dielectric materials. As shown in FIG. 22, dielectric material 2221 can include respective portions formed at opposite sides (e.g., left and right sides) of each structure 2035.

FIG. 23 shows memory device 400 after respective portions of dielectric material (e.g., silicon nitride) 1953 at locations 2349 in region 401 is removed. An etch (e.g., punch etch) process can be used in the processes associated with FIG. 23 to remove dielectric material 1953 at locations 2349. As shown in FIG. 23, conductive material 1849 is exposed at respect locations 2349.

FIG. 24 shows memory device 400 after respective portions of conductive material (e.g., polysilicon) 1849 at locations 2349 in region 401 are removed (e.g., recessed). As shown in FIG. 24, the remaining portions of conductive material 1849 remain exposed at each of locations 2349.

FIG. 25 shows memory device 400 after a conductive material 2549 is formed in region 401 including locations 2349. Conductive material 2549 can include metal or other conductive materials. As shown in FIG. 25, conductive materials 2549 can contact respective portions of conductive material 1849 at locations 2349 (labeled in FIG. 24). Conductive material 2549 can include respective portions formed between two adjacent structures 1570. A portion of conductive material 2549 and a portion of conductive material 1849 between two adjacent structures 1570 are part of a conductive contact for a memory element of memory device 400 (like conductive contact 210' in FIG. 3A and FIG. 3B of memory device 200).

Figures 26A, 26B:
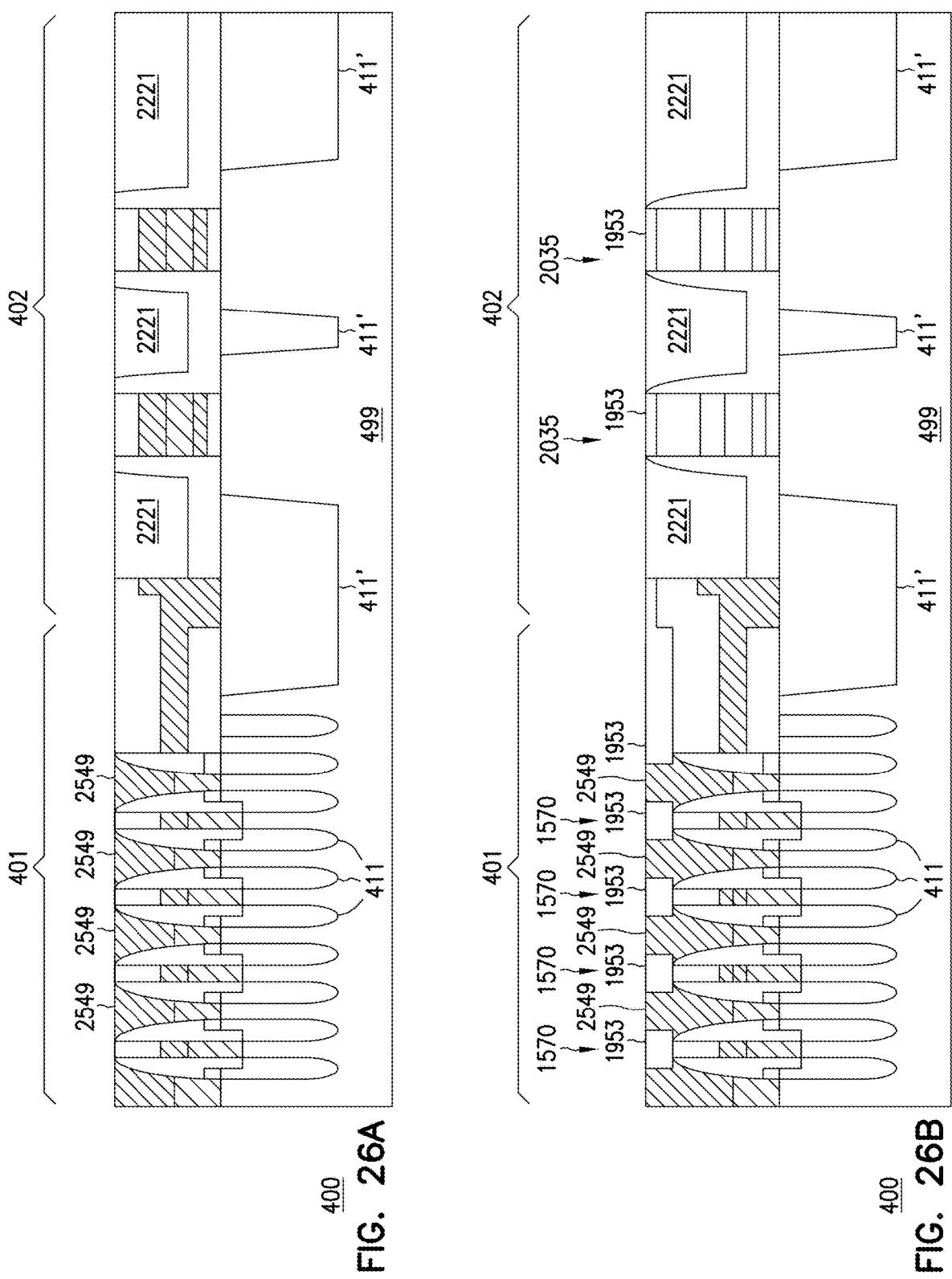

FIG. 26A shows memory device 400 after a portion (e.g., top portion) of conductive material 2549 is removed (e.g., using a chemical-mechanical polishing (CMP) process). As shown in FIG. 26A, dielectric material (e.g., silicon nitride) 1953 (labeled in FIG. 19 and FIG. 24, formed in the processes associated with FIG. 19) may be removed by the process associated with FIG. 26A.

FIG. 26B shows alternative processes of forming memory device 400 in which at least a portion of dielectric material 1953 can remain in one or both of regions 401 and 402 of memory device 400. For example, in alternative processes, structures 1570 (e.g., bit line stacks) in region 401 can be formed to be taller than structures (e.g., gate stacks) 2035 in region 402, so that at least a portion of dielectric material 1953 can remain over structures 2035.

Figure 29:
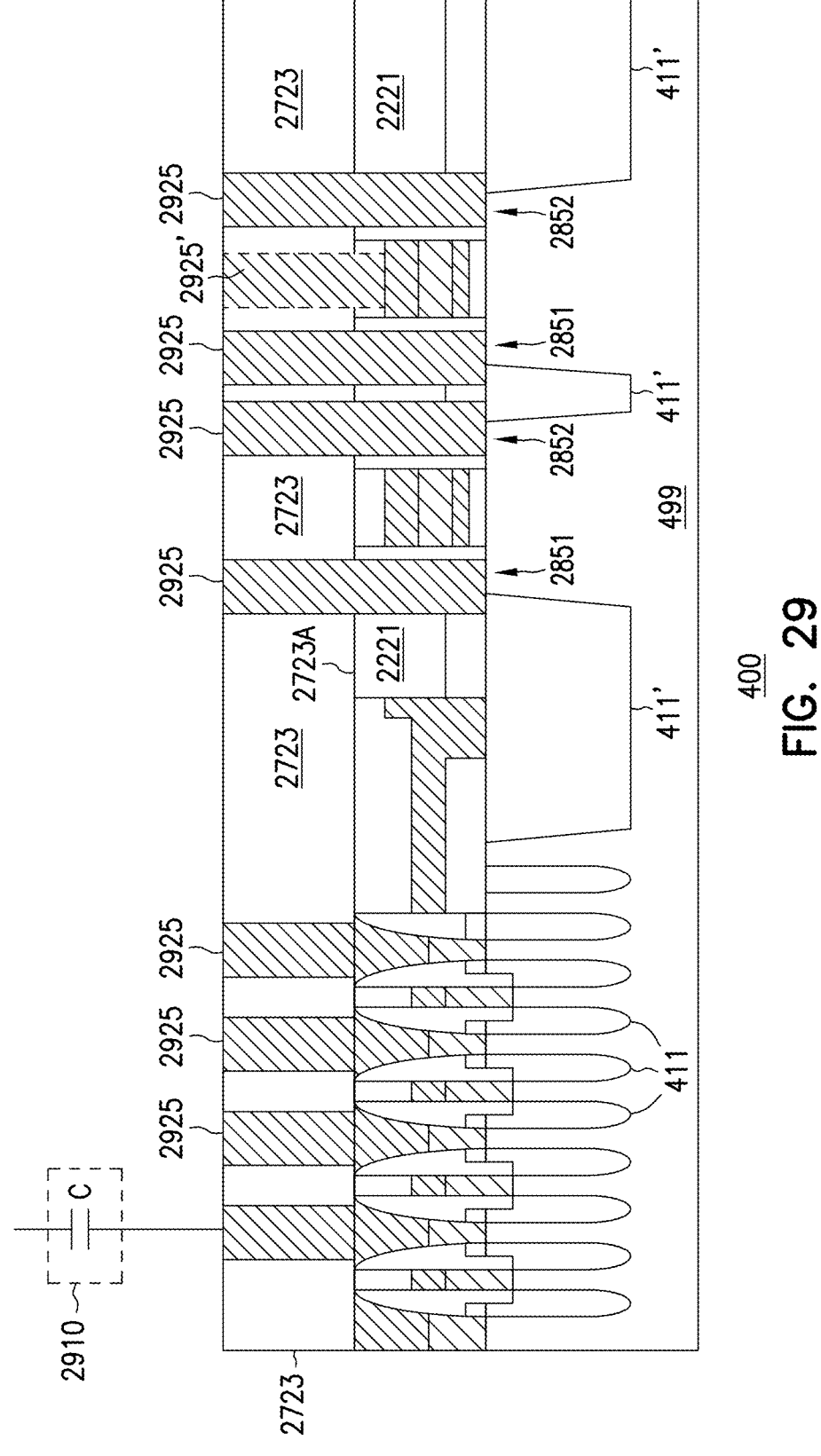

In alternative processes of forming memory device 400, conductive material 2549 (FIG. 25) can be formed as part of the processes of forming conductive material 2925 (FIG. 29).

Figures 27, 28:
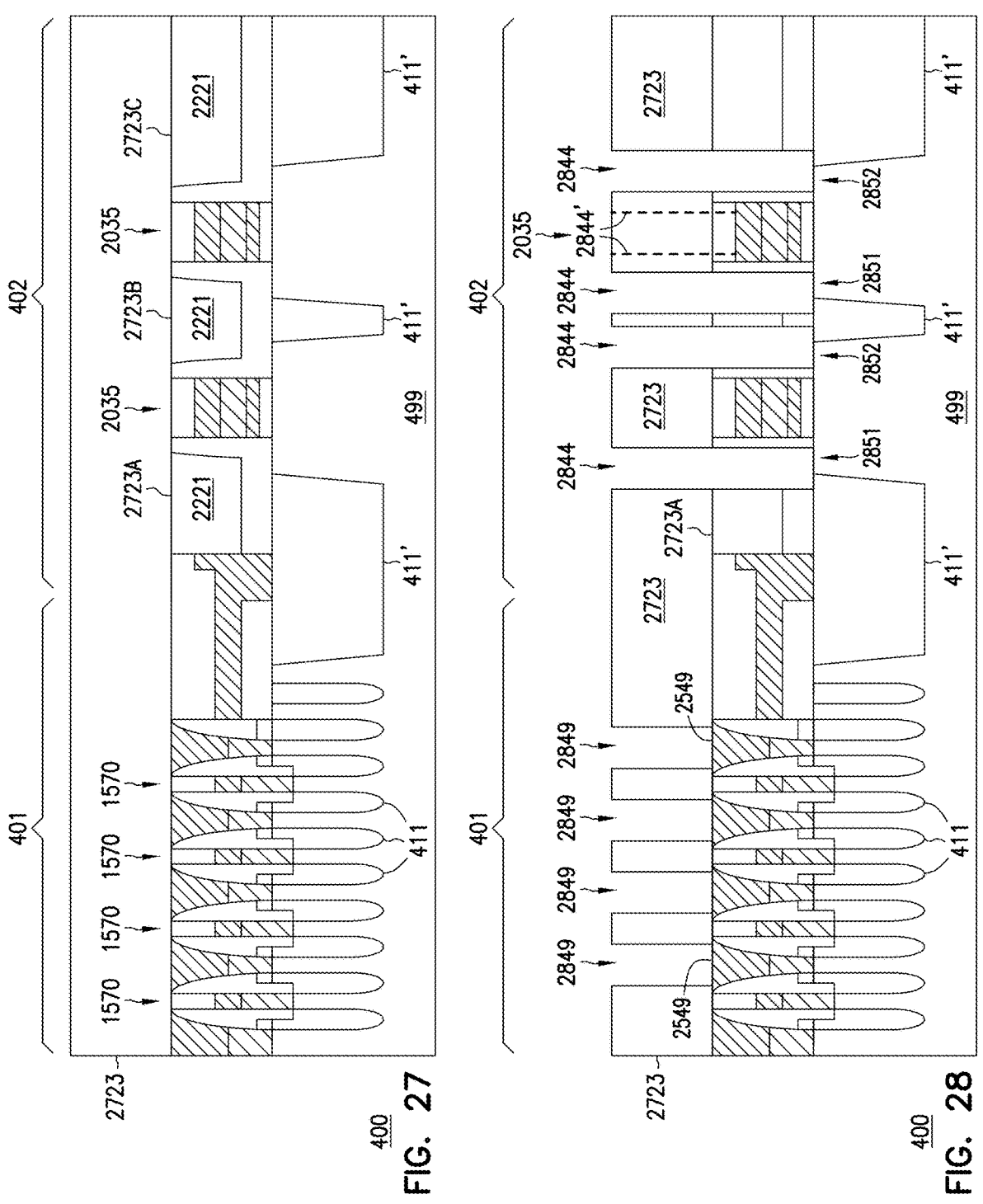

FIG. 27 shows memory device 400 after a dielectric material 2723 is formed (e.g., deposited) over structures 1570 and 2035, dielectric material 2221, and other materials in regions 401 and 402. Dielectric material 2723 can include silicon nitride or other dielectric materials. As shown in FIG. 27, dielectric material 2723 can include respective portions contacting (e.g., directly coupled to) respective portions of dielectric material 2221 at locations 2723A, 2723B, and 2723C. As shown in FIG. 27, dielectric material 2723 can also contact (e.g., can be directly coupled to) dielectric material 1454 of structures 1570.

FIG. 28 shows memory device 400 after openings (e.g., holes) 2849 are formed in region 401 and openings (e.g., holes) 2844 are formed in region 402. Forming openings 2849 can include removing part of dielectric material 2723 in region 401 to expose conductive material 2549 at openings 2849. Forming openings 2844 can include removing the materials at the locations of openings 2844 to expose portions 2851 and 2852 of a region (e.g., active region) in substrate 499. Portions 2851 and 2852 can be similar to or the same as the portions for source 251' and drain 252' in region (e.g., peripheral region) 302 of memory device 200 in FIG. 3D. As shown in FIG. 28, an opening (e.g., hole) 2844' may also be formed (e.g., optionally formed) to expose a conductive material (e.g., conductive material 1354) of one of structures 2035.

FIG. 29 shows memory device 400 after a conductive material 2925 is formed in openings 2849 region 401 and openings 2844 in region 402. Conductive materials can include metal (e.g., tungsten) or other conductive materials. As shown in FIG. 29, conductive materials 2925 in region 401 can contact respective portions of conductive material 2549 (labeled in FIG. 28). Conductive materials 2925 in region 401 can be part of conductive contacts of memory device 400 that can be similar to conductive contacts (e.g., capacitor contact) 210' of memory device 200 in FIG. 3A. As shown in FIG. 29, conductive materials 2925 in region 402 can contact respective portions 2851 and 2852 of substrate 499. Conductive materials 2925 in region 402 can be part of conductive contacts (source/drain contacts) of memory device 400 that can be similar to conductive contacts (e.g., source/drain contacts) 244 coupled to source and drain 251' and 252' in region 302 (FIG. 3A and FIG. 3D) of memory device 200. As shown in FIG. 29, a conductive material 2925' can also be formed (e.g., optionally formed) in opening 2844' (labeled in FIG. 28) and coupled to a conductive material (e.g., conductive material 1354 of structure (e.g., gate stack) 2035, labeled in FIG. 20). As shown in FIG. 29, at least a portion of dielectric material 2723 remains contacting at least a portion of dielectric material 2221 (e.g., the portion at locations 2723A).

The process of forming memory device 400 as described above with reference to FIG. 4 through FIG. 29 can include additional processes after the processes associated with FIG. 29 are performed. For example, additional processes can include forming part of charge storage structure 2910 (which can include a capacitor C) coupled to conductive material 2925 and other elements and interconnections to complete the processes of forming memory device 400.

The processes described above provide improvements and benefits over some alternative processes. For example, described above, part of memory device 400 can be formed in an order in which structures (e.g., gate stacks) 2035 (FIG. 31) can be formed after structures (e.g., bit line stacks) 1570 (FIG. 16) are formed. Forming part of memory device 400 in this order can improve (e.g., minimize) thermal budget during the processes of forming structures 2035 and improve performance and reliability of structures 2035. For example, structures 2035 (FIG. 31) can alternatively be formed before (or alternatively at the same time) as structures (e.g., bit line stacks) 1570 (FIG. 16) are formed. However, structures 2035 may be damaged from a relatively high temperature used during formation of structures 1570 if structures 2035 are formed before structures 1570 are formed. In the processes described above with reference to FIG. 4 through FIG. 29, by forming memory device 400 in the described order (e.g., structures 2035 are formed after structures 1570), structures 2035 can avoid the relatively high temperature and potential damage because structures 1570 are already formed by the time structures 2035 are formed. Avoiding such a high temperature can improve the thermal budget structures during part of the processes of forming structures 2035 (e.g., during a stress process associated with FIG. 21) and can improve (e.g., enhance) channel mobility of circuitry associated with structures 2035.

As described above, memory device 200 (FIG. 2 through FIG. 3D) can be formed using processes similar to or the same as the processes for forming memory device 400 (FIG. 4 through FIG. 29). Thus, memory device 200 can also have improvements and benefits like memory device 400.

FIG. 30 through FIG. 38 show different views of structures during processes of forming memory device 400', according to some embodiments described herein. Some of the processes of forming memory device 400' are similar to or the same as the processes of forming memory device 400. Thus, for simplicity, descriptions of similar or the same elements between memory devices 400 and 400' are not repeated.

Figures 30, 31:
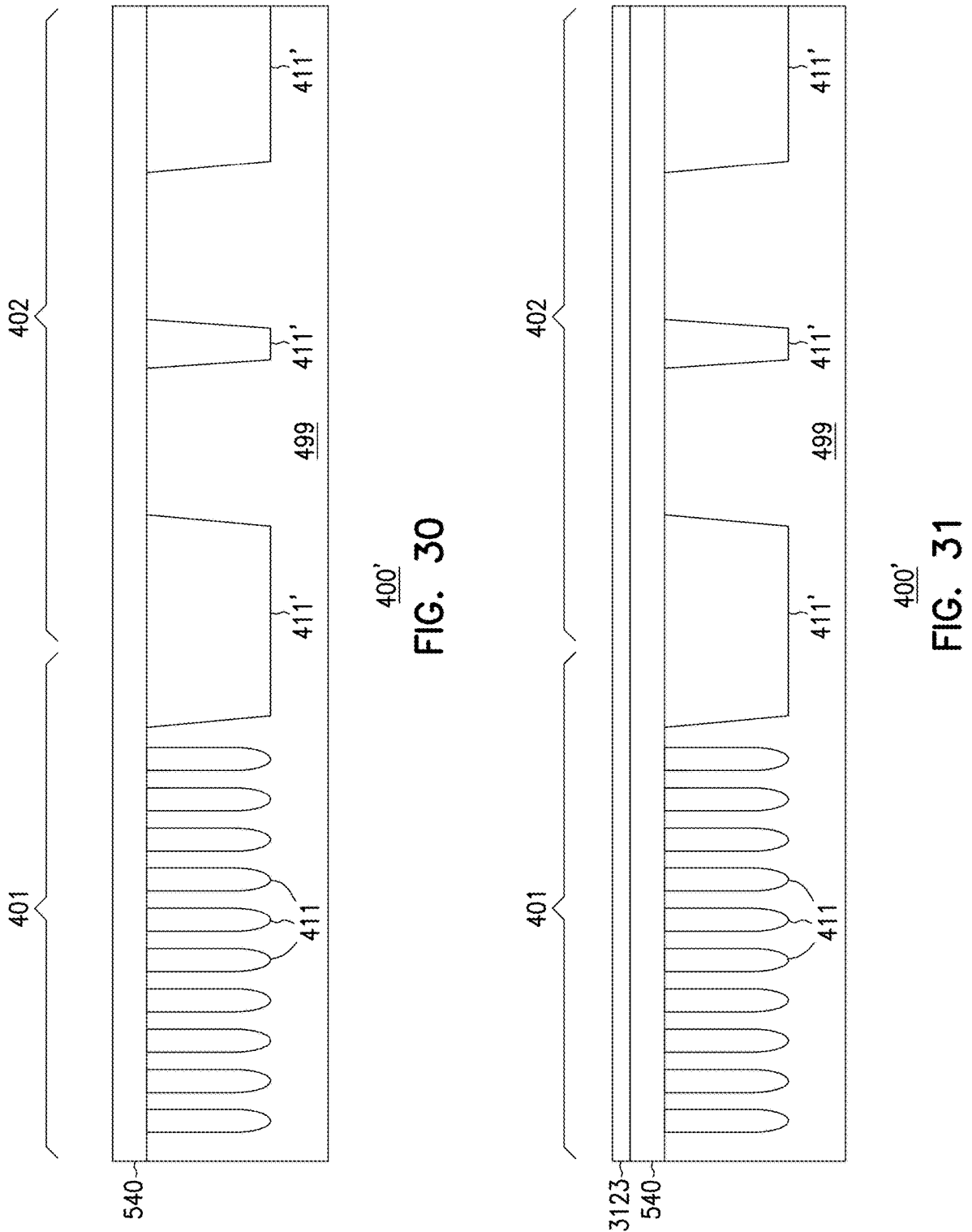

FIG. 30 shows memory device 400' after some of the processes similar to or the same as processes of forming memory device 400 associated with FIG. 5 have been performed.

FIG. 31 shows memory device 400' after a dielectric material (e.g., silicon nitride) 3123 is formed over dielectric material 540 in regions 401 and 402.

FIG. 32 shows memory device 400' after a portion of dielectric material 3123 and dielectric material 540 in region 402 are removed.

FIG. 33 shows memory device 400' after a dielectric material (e.g., a high-K dielectric material) 3327, a conductive material (e.g., metal) 3325, and a conductive material (e.g., conductively doped polysilicon) 3315 are formed in regions 401 and 402.

Figures 34, 35:
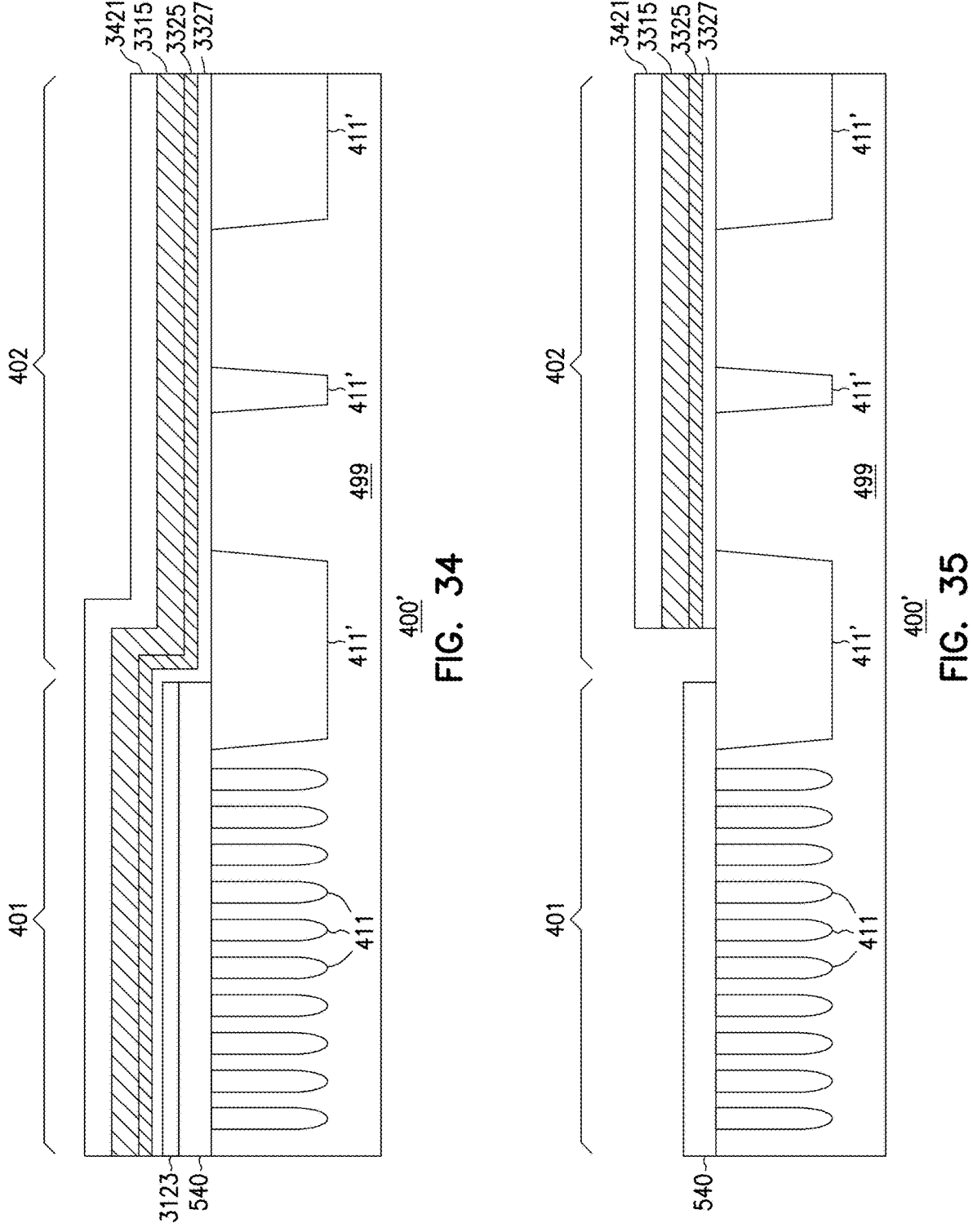

FIG. 34 shows memory device 400' after a dielectric material (e.g., silicon dioxide) 3421 is formed over other materials in regions 401 and 402.

FIG. 35 shows memory device 400' after a portion of each of dielectric material 3123 (labeled in FIG. 34), dielectric materials 3327, conductive material 3325, conductive material 3315, and dielectric material 3421 is removed from region 401.

Figures 36, 37:
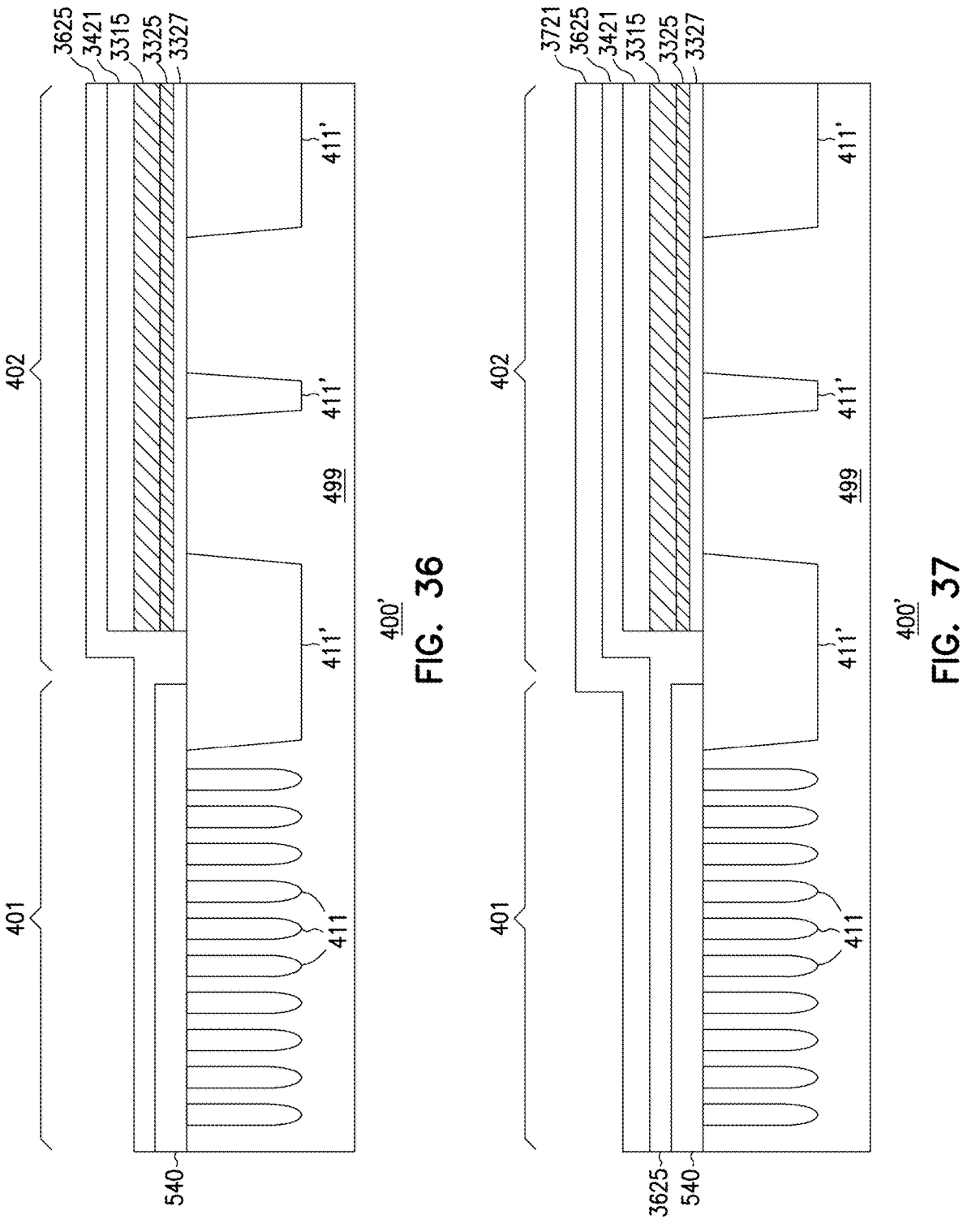

FIG. 36 shows memory device 400' after a material (e.g., polysilicon) 3625 is formed over other materials in regions 401 and 402.

FIG. 37 shows memory device 400' after a dielectric material (e.g., silicon dioxide) 3721 is formed in regions 401 and 402.

Figure 38:
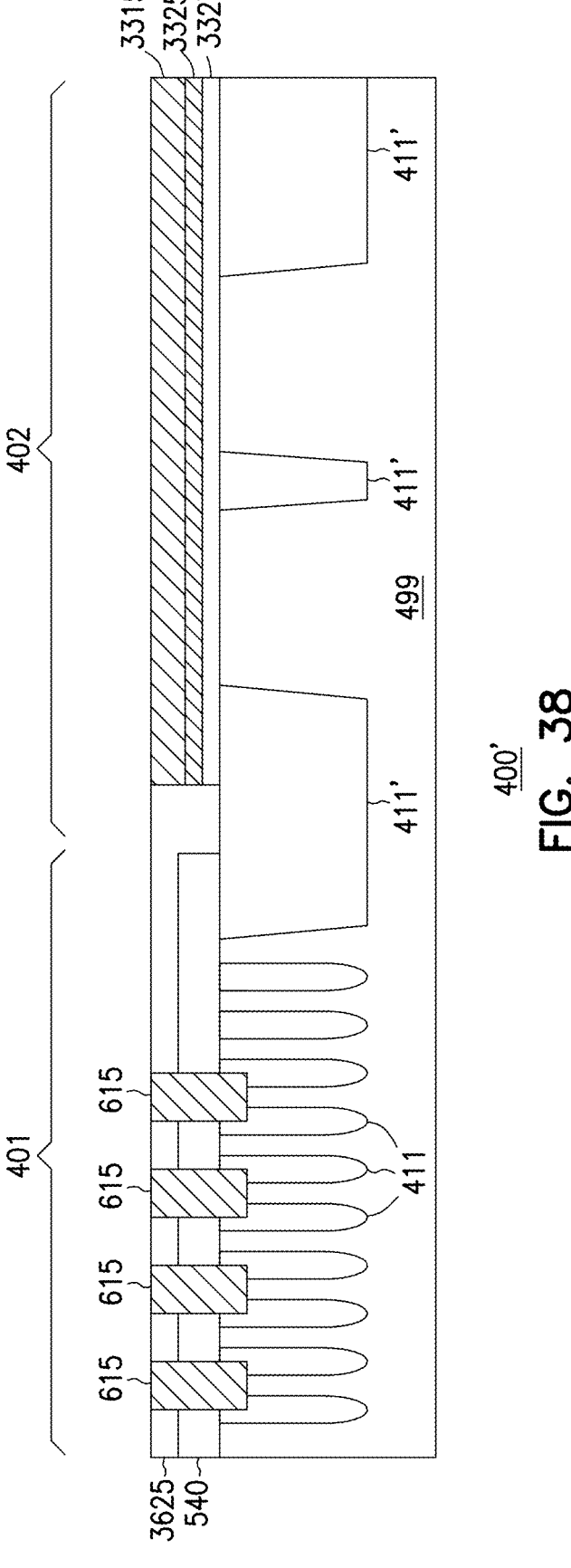

FIG. 38 shows memory device 400 after conductive material 615 is formed through respective portions of material 3625 and dielectric material 540 in region 401. The processes associated with FIG. 38 can include removing dielectric material 3721 from region 401 after conductive material 615 is formed. The processes associated with FIG. 38 can also include removing dielectric material 3721, material 3625, dielectric material 3421 from region 402. Subsequent processes of forming memory device 400' can be the same as the processes of forming memory device 400 associated with FIG. 13 through FIG. 29. Memory device 400' can include improvements and benefits like those of memory device 400.

The illustrations of apparatuses (e.g., memory devices 100, 200, 400 and 400') and methods (e.g., methods of forming memory devices 400 and 400') are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 400 and 400') or a system (e.g., an electronic item that can include any of memory devices 100, 200, 400 and 400').

Any of the components described above with reference to FIG. 1 through FIG. 38 can be implemented in a number of ways, including simulation via software. Thus, apparatuses (e.g., memory devices 100, 200, 400 and 400'), or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100 and 200) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 38 include apparatuses and methods of forming the apparatuses. One of the apparatuses includes data lines; first structures located in a first region, electrically separated from each other, and including first conductive contacts coupled to the data lines; second conductive contacts located in the first region and coupled to memory elements of the apparatus; second structures located in a second region, electrically separated from each other, and including respective gates of transistors in the second region; a first dielectric material formed in the second region and including a first portion and a second portion, the first portion formed at a first side of a structure among the second structures, the second portion formed at a second side first of the structure; and a second dielectric material formed over the first structures and the second structures. A portion of the second dielectric material contacts the first portion of the first dielectric material. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

In the detailed description and the claims, the terms "first," "second," and "third," etc. are used merely as labels, and are not intended to impose numerical requirements on their objects.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
data lines;
first structures located in a first region of the apparatus, the first structures electrically separated from each other and including first conductive contacts coupled to the data lines;
second conductive contacts located in the first region and coupled to memory elements of the apparatus;
second structures located in a second region of the apparatus, the second structures electrically separated from each other and including respective gates of transistors in the second region, the second region including a portion of a semiconductor substrate, the portion of the semiconductor substrate including a source and a drain of a transistor among the transistors, wherein the gates include a conductive material formed over the portion of the semiconductor substrate including the source and the drain of the transistor, and the conductive material is separated from the source and the drain of the transistor;
a first dielectric material formed in the second region, the first dielectric material including a first portion and a second portion, the first portion formed at a first side of a structure among the second structures, the second portion formed at a second side first of the structure; and
a second dielectric material formed over the first structures and the second structures, wherein a portion of the second dielectric material contacts the first portion of the first dielectric material, wherein a structure among the first structures includes a first conductive material contacting a substrate of the apparatus, a second conductive material formed over the first conductive material, the second conductive material being separated from the substrate by the first conductive material, and a third dielectric material formed over and contacting the second conductive material, wherein the second dielectric material contacts the third dielectric material.

2. The apparatus of claim 1, wherein:
the first dielectric material includes silicon dioxide; and
the second dielectric material includes silicon nitride.

3. The apparatus of claim 1,
wherein one of the data lines includes part of the second conductive material.

4. The apparatus of claim 3, wherein:
the first conductive material includes polysilicon; and
the second conductive material includes metal.

5. The apparatus of claim 3, wherein the structure among the first structures includes a first dielectric structure formed on a first side of the first conductive material and a first side of the second conductive material, and a second dielectric structure formed a second side of the first conductive material, and a second side of the second conductive material, and wherein:
the first dielectric structure contacts the first side of the first conductive material and the first side of the second conductive material; and
the second dielectric structure contacts the second side of the first conductive material and the second side of the second conductive material.

6. The apparatus of claim 1, wherein each of the second structures includes:

a dielectric material formed over a substrate of the apparatus, a first conductive material formed over the dielectric material;

a second conductive material formed over the first conductive material; and a third conductive material formed over the second conductive material.

7. The apparatus of claim 6, wherein:

the first conductive material includes metal;

the second conductive material includes polysilicon; and the third conductive material includes metal.

8. The apparatus of claim 1, wherein the apparatus comprises a memory device, the first region includes a memory array region of the memory device, and the second region includes a peripheral region of the memory device.

9. The apparatus of claim 1, wherein the memory element includes a capacitor.

10. A memory device comprising:

data lines;

first structures located in a memory array region of the memory device, the first structures electrically separated from each other and including first conductive contacts coupled to the data lines;

second conductive contacts located in the memory array region of the memory device and coupled to memory elements of the memory device;

second structures located in a peripheral region of the memory device, the second structures electrically separated from each other and including respective gates of transistors in the memory array region of the memory device;

a first dielectric material formed in the peripheral region of the memory device, the first dielectric material including a first portion and a second portion, the first portion formed at a first side of a structure among the second structures, the second portion formed at a second side first of the structure; and a second dielectric material formed over the first structures and the second structures, wherein a portion of the second dielectric material contacts the first portion of the first dielectric material, wherein a structure among the first structures includes a first conductive material contacting a substrate of the apparatus, a second conductive material formed over the first conductive material, the second conductive material being separated from the substrate by the first conductive material, and a third dielectric material formed over and contacting the second conductive material, wherein the second dielectric material contacts the third dielectric material.

11. The apparatus of claim 10, wherein:

the first dielectric material includes silicon dioxide; and the second dielectric material includes silicon nitride.

12. The apparatus of claim 10, wherein one of the data lines includes part of the second conductive material.

13. The apparatus of claim 12, wherein:

the first conductive material includes polysilicon; and the second conductive material includes metal.

14. The apparatus of claim 12, wherein the structure among the first structures includes a first dielectric structure formed on a first side of the first conductive material and a first side of the second conductive material, and a second dielectric structure formed a second side of the first conductive material, and a second side of the second conductive material, and wherein:

the first dielectric structure contacts the first side of the first conductive material and the first side of the second conductive material; and the second dielectric structure contacts the second side of the first conductive material and the second side of the second conductive material.

15. The apparatus of claim 10, wherein each of the second structures includes:

a dielectric material formed over a substrate of the apparatus, a first conductive material formed over the dielectric material;

a second conductive material formed over the first conductive material; and a third conductive material formed over the second conductive material.

16. The apparatus of claim 15, wherein:

the first conductive material includes metal;

the second conductive material includes polysilicon; and the third conductive material includes metal.

17. The apparatus of claim 10, wherein the memory element includes a capacitor.

* * * * *